United States Patent
Angioni

(10) Patent No.: US 11,309,507 B2
(45) Date of Patent: Apr. 19, 2022

(54) CONTROL OF THE POSITION OF QUANTUM DOTS IN EMISSIVE LAYER OF QUANTUM DOT LIGHT EMITTING DIODE

(71) Applicant: Sharp Kabushiki Kaisha, Osaka (JP)

(72) Inventor: Enrico Angioni, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 16/910,339

(22) Filed: Jun. 24, 2020

(65) Prior Publication Data

US 2021/0408417 A1  Dec. 30, 2021

(51) Int. Cl.
*H01L 51/50* (2006.01)
*H01L 51/00* (2006.01)
*H01L 51/56* (2006.01)

(52) U.S. Cl.
CPC ........ *H01L 51/502* (2013.01); *H01L 51/0007* (2013.01); *H01L 51/0028* (2013.01); *H01L 51/5056* (2013.01); *H01L 51/5072* (2013.01); *H01L 51/56* (2013.01)

(58) Field of Classification Search
CPC .............. H01L 51/502; H01L 51/5072; H01L 51/5056
See application file for complete search history.

(56) References Cited

FOREIGN PATENT DOCUMENTS

| CN | 106374056 A | 1/2017 |
| IN | 201747022708 A | 7/2017 |
| WO | WO 2017/117994 A1 | 7/2017 |
| WO | WO 2017/121163 A1 | 7/2017 |

OTHER PUBLICATIONS

Park et al., Alternative Patterning Process for Realization of Large-Area, Full-Color, Active Quantum Dot Display (Nano Letters, 2016, pp. 6946-6953).
Gaikwad et al., Identifying orthogonal solvents for solution processed organic transistors, Organic Electronics 30 (2016) pp. 18-29.

*Primary Examiner* — Anthony Ho
(74) *Attorney, Agent, or Firm* — Renner, Otto, Boisselle & Sklar, LLP

(57) ABSTRACT

A light-emitting device includes an anode, cathode, and a combined charge transport and emissive layer (CCTEL) disposed on a deposition surface between the anode and cathode. The CCTEL includes a crosslinked charge transport material and quantum dots, the quantum dots distributed unevenly within the crosslinked charge transport material and arranged relative to the deposition layer. The quantum dots include nucleophilic or electrophilic centers and ligands respectively bonded to the quantum dots. The deposition surface has nucleophilic or electrophilic properties. A method of forming the CCTEL includes the steps of depositing a mixture on a deposition surface having nucleophilic or electrophilic properties. The mixture includes a solvent, cross-linkable charge transport material, and quantum dots comprising nucleophilic or electrophilic centers and ligands respectively bonded to the quantum dots. At least a portion of the mixture to an activation stimulus to crosslink the cross-linkable material.

12 Claims, 15 Drawing Sheets

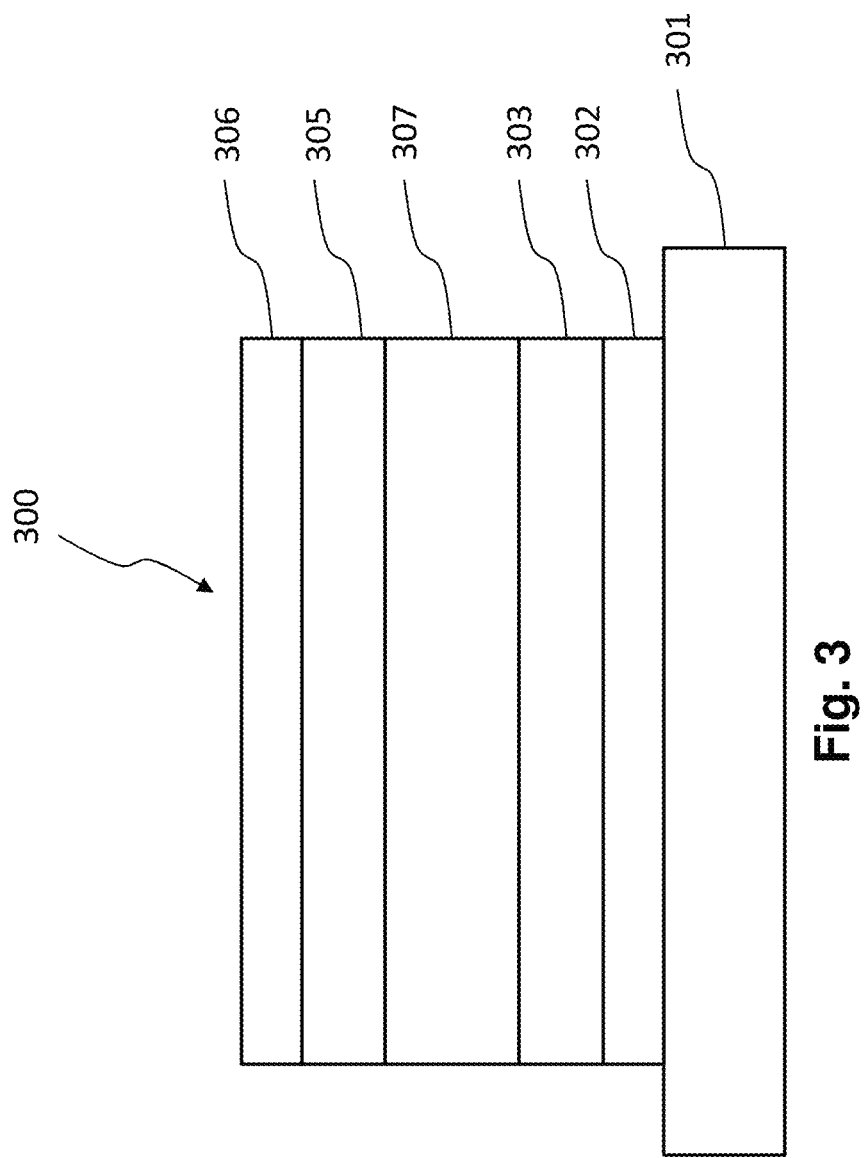

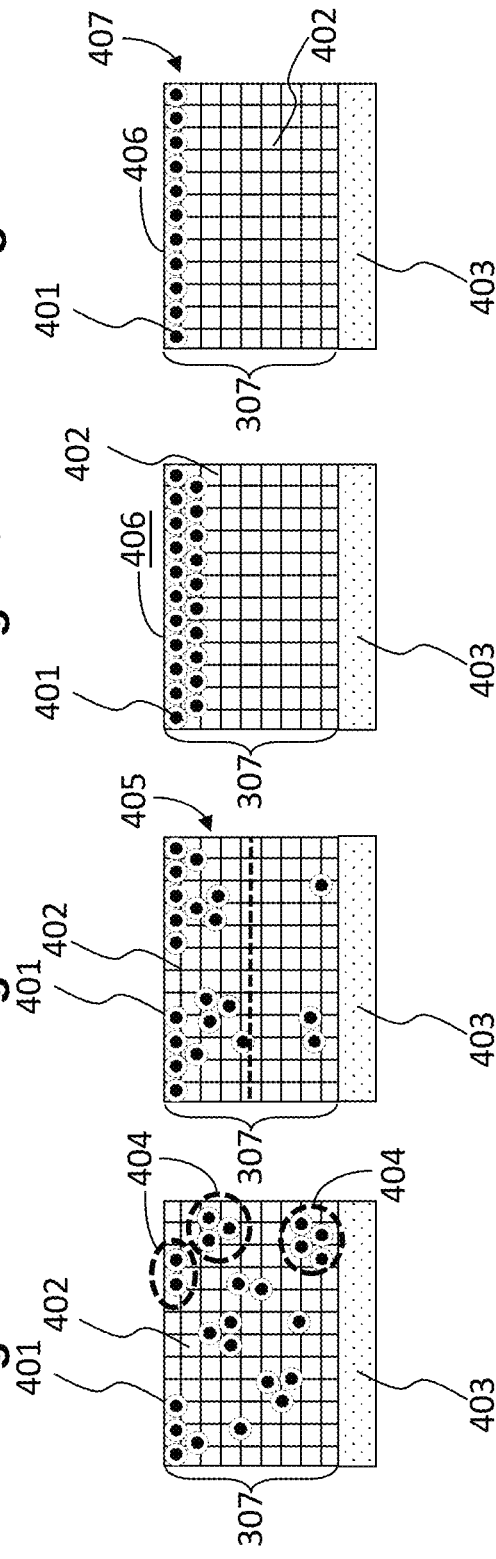

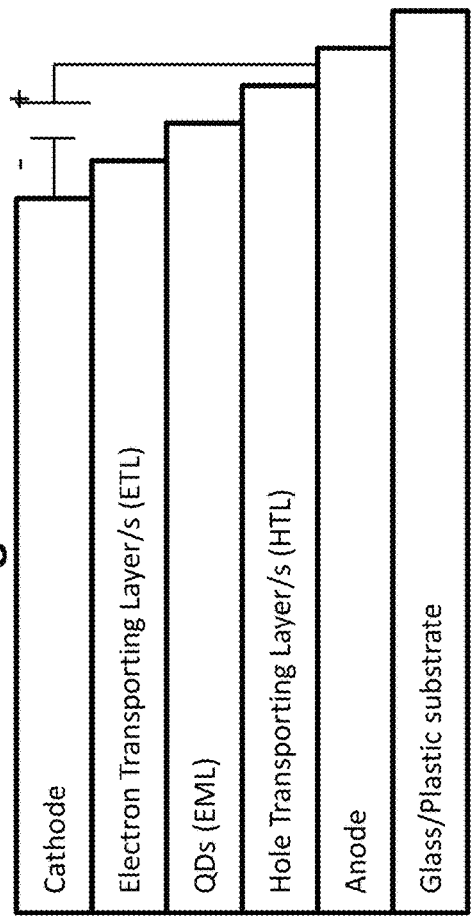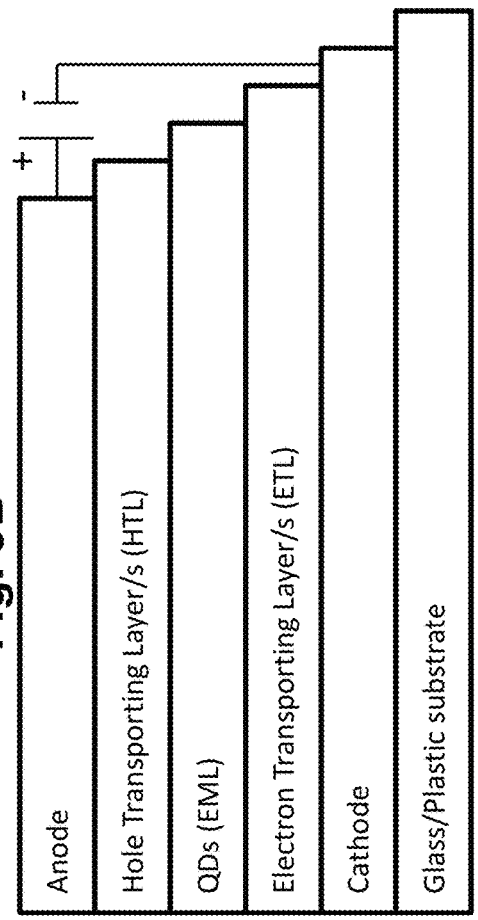

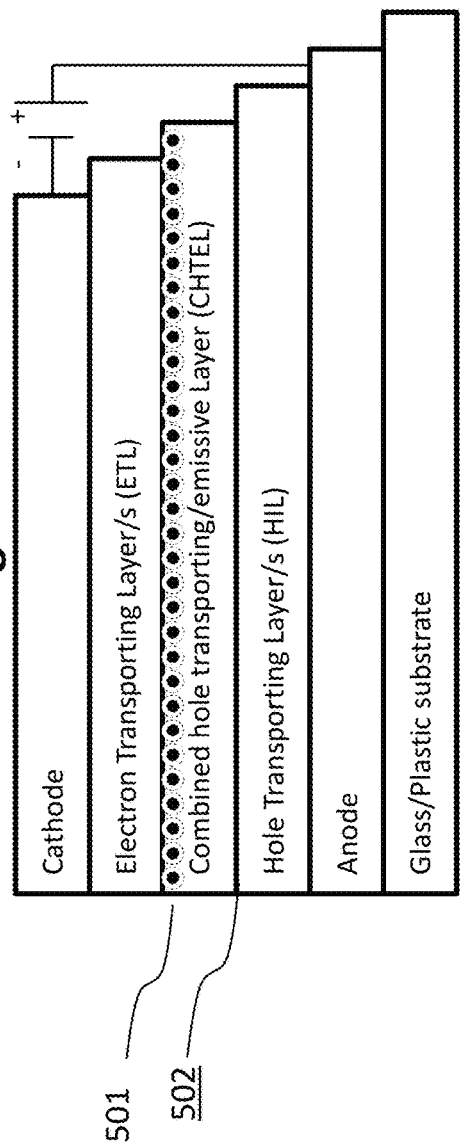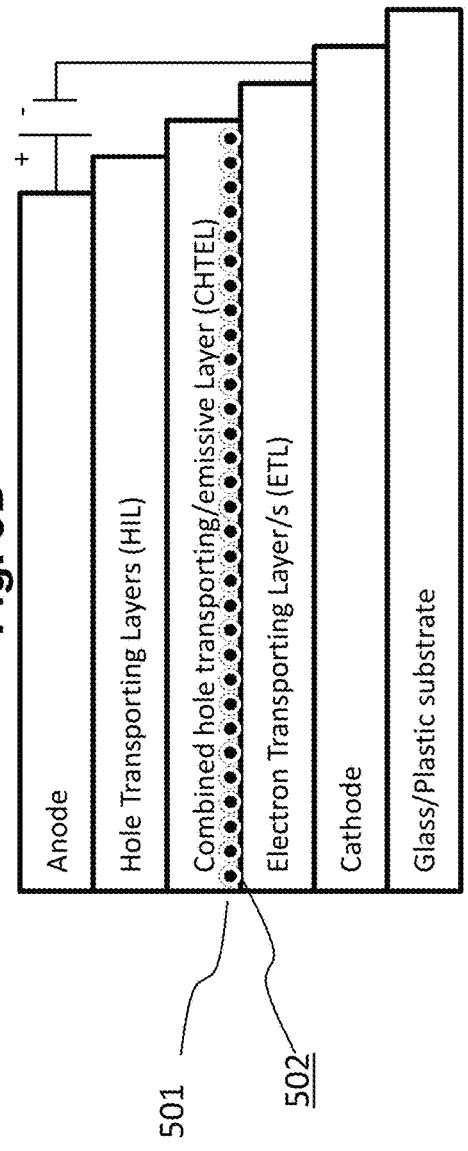

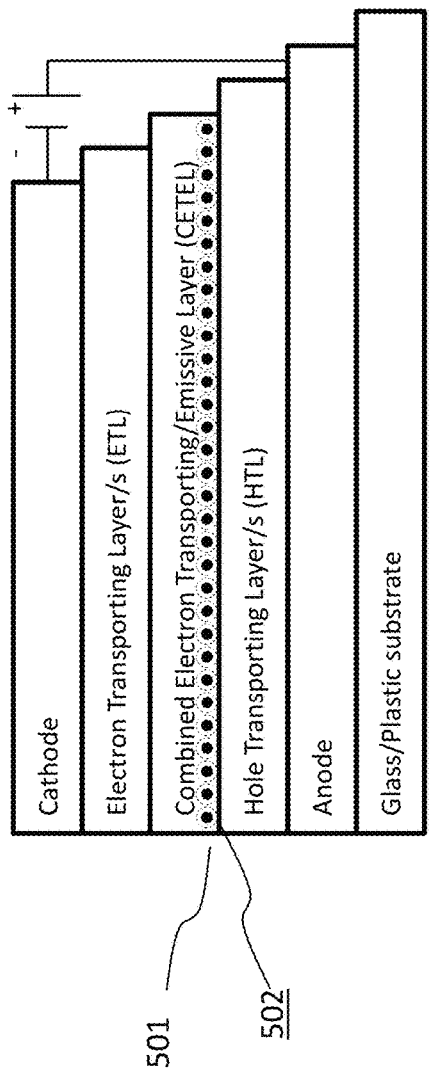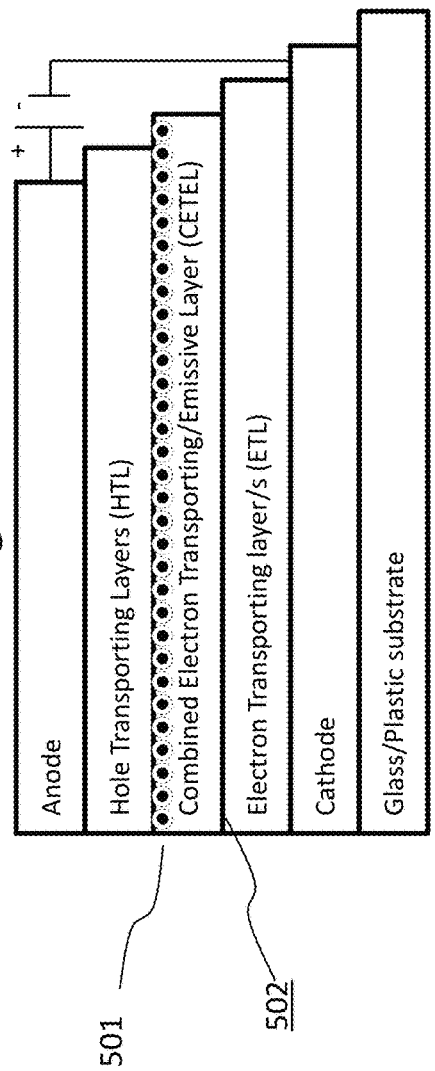

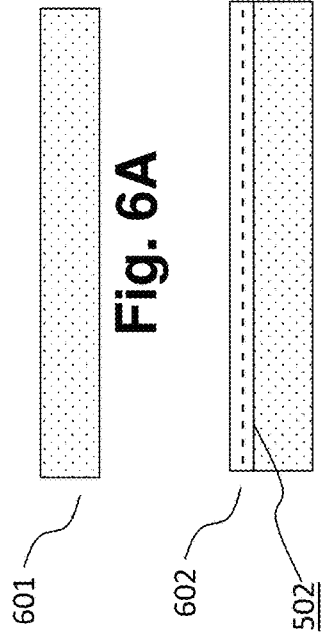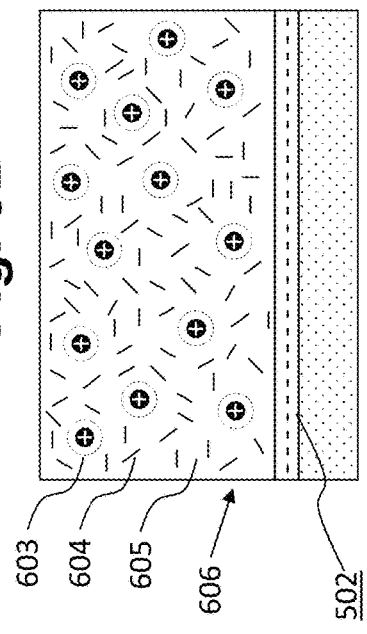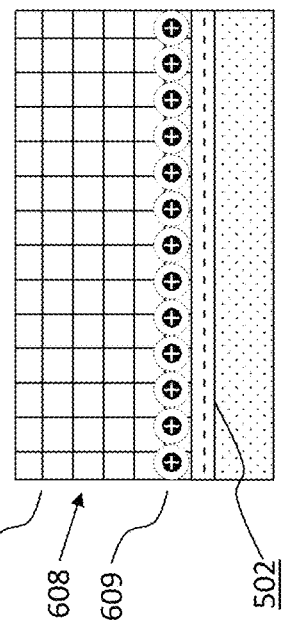

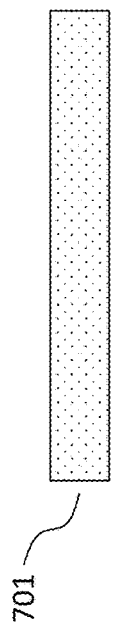
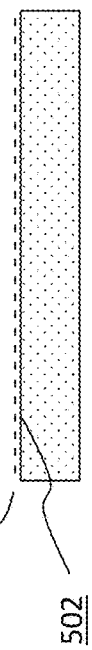
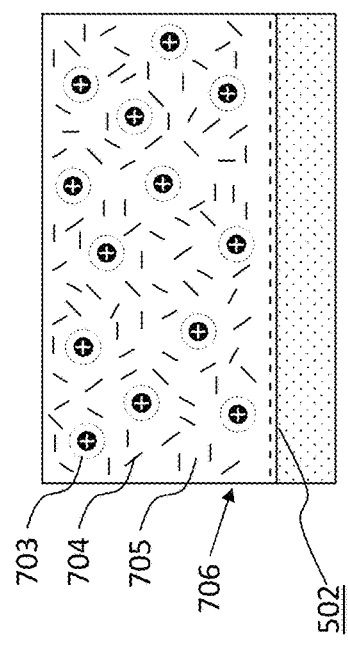
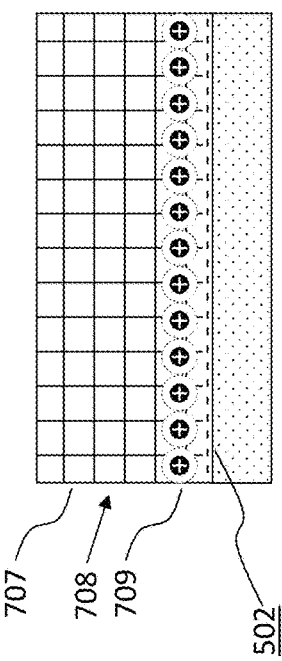

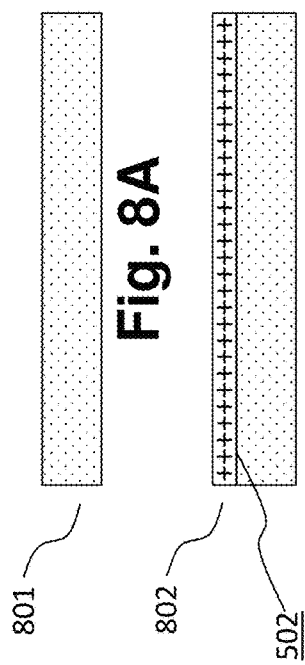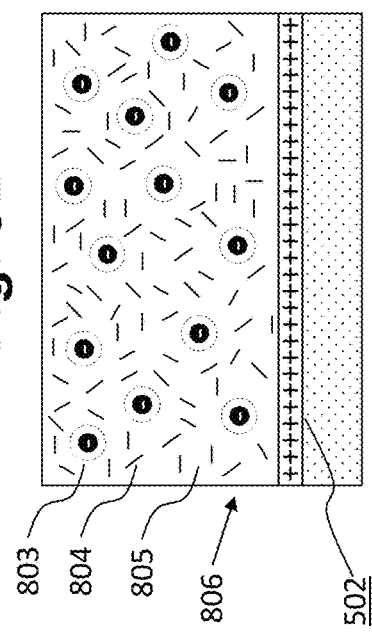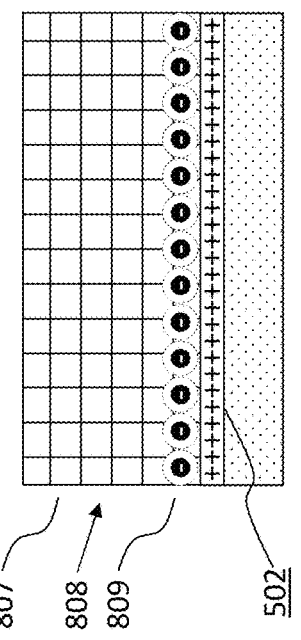

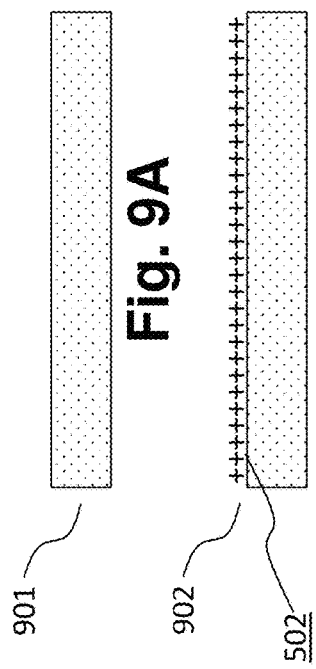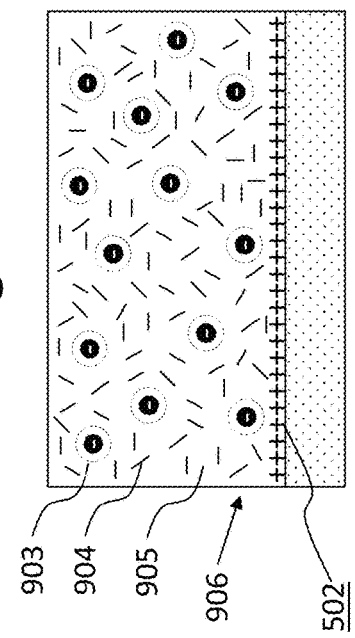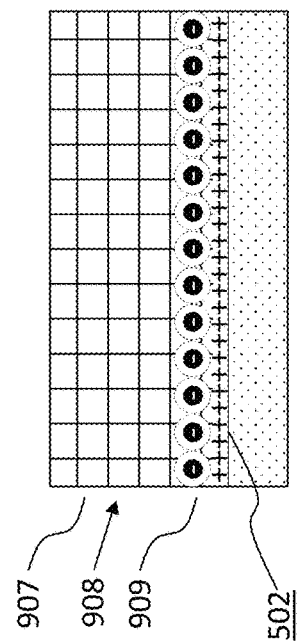

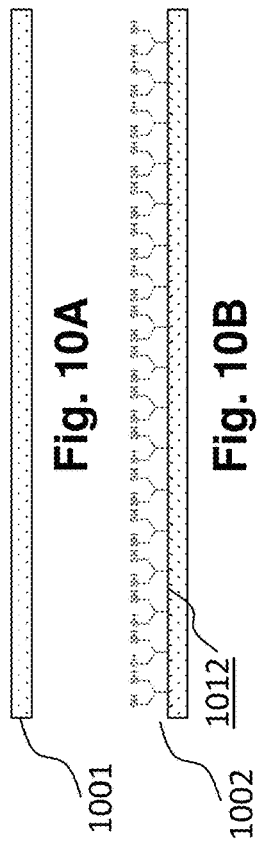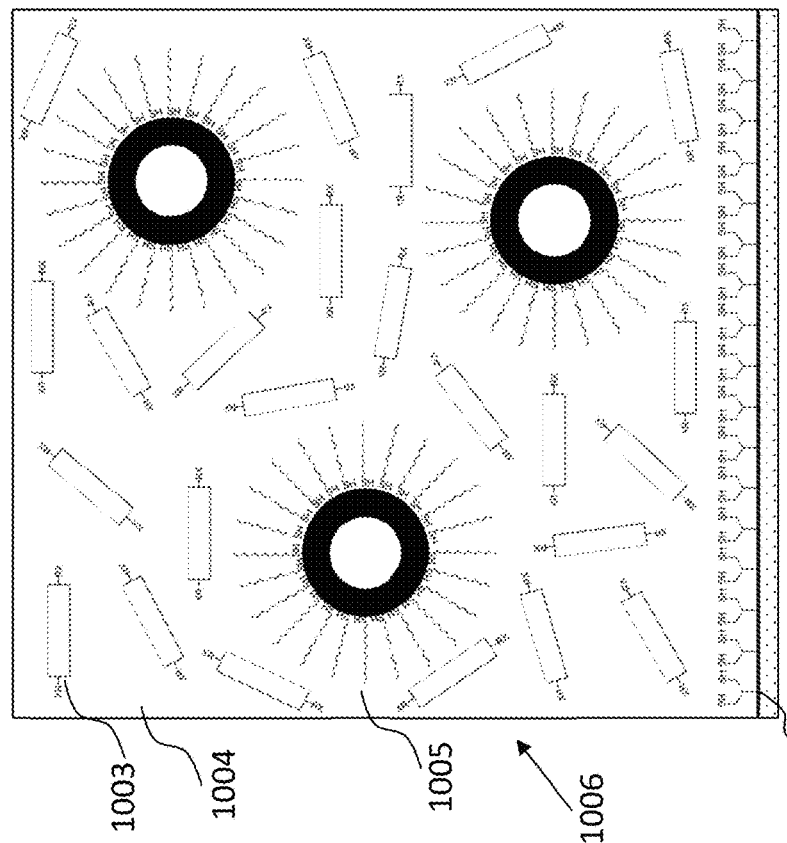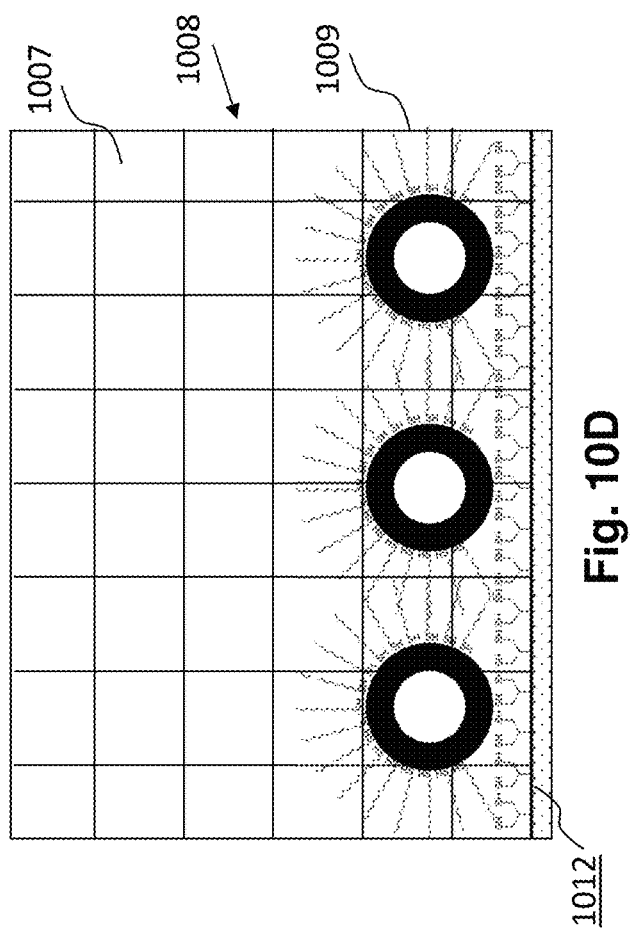

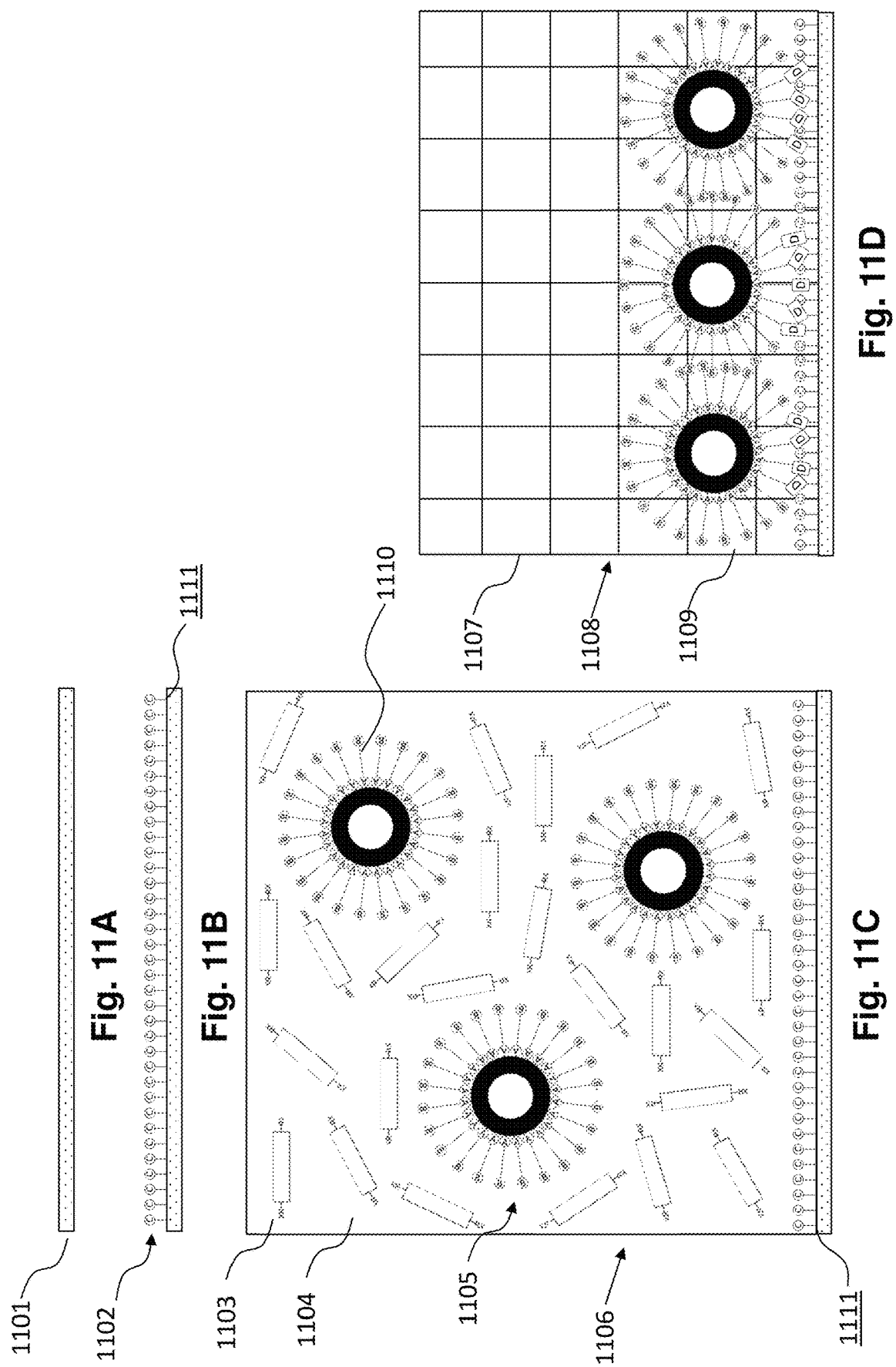

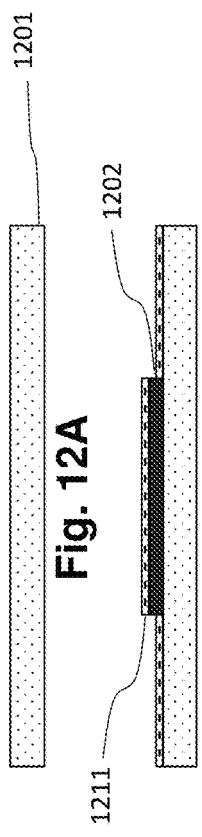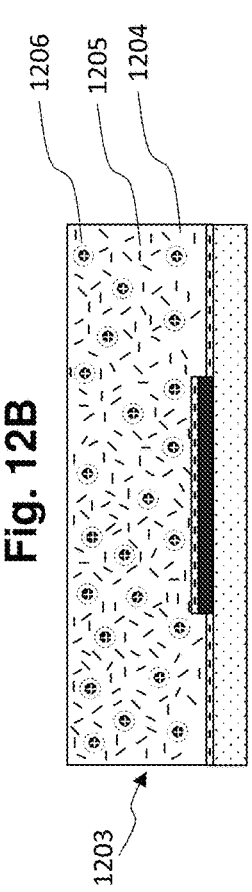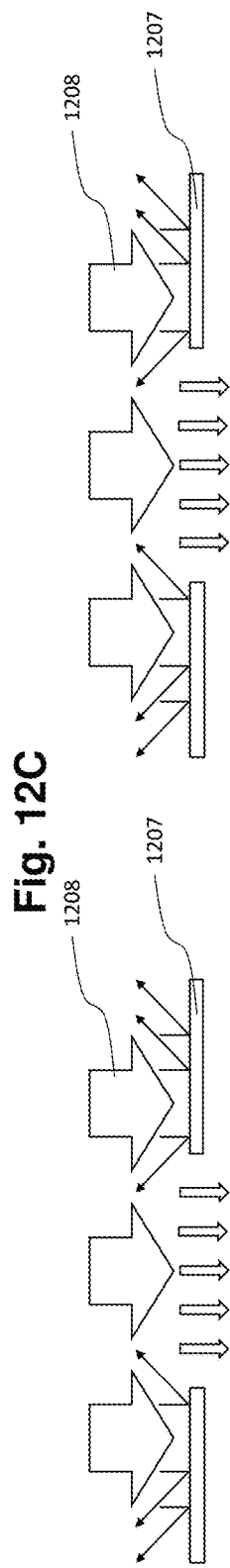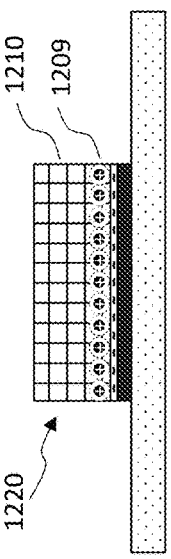

CONTROL OF THE POSITION OF QUANTUM DOTS IN EMISSIVE LAYER OF QUANTUM DOT LIGHT EMITTING DIODE

TECHNICAL FIELD

The present application relates to light-emitting devices, and in particular to light-emitting devices including a cross-linked emissive layer containing quantum dots. The light-emitting devices may be implemented in display applications, for example in high resolution, multicolor displays. The present application further relates to methods of fabricating such light-emitting devices.

BACKGROUND ART

A common architecture for a light-emitting device includes an anode, which acts as hole injector; a hole transport layer disposed on the anode; an emissive material layer disposed on the hole transport layer; an electron transport layer disposed on the emissive material layer; and a cathode, which also acts as an electron injector, disposed on the electron transport layer. When a forward bias is applied between the anode and cathode, holes and electrons are transported in the device through the hole transport layer and electron transport layer, respectively. The holes and electrons recombine in the emissive material layer, which generates light that is emitted from the device. When the emissive material layer includes an organic material, the light-emitting device is referred to as an organic light-emitting diode (OLED). When the emissive material layer includes nanoparticles, sometimes known as quantum dots (QDs), the device is commonly referred to as either a quantum dot light-emitting diode (QLED, QD-LED) or an electroluminescent quantum dot light-emitting diode (ELQLED, QDEL).

Each of the layers of the light-emitting device can be deposited by different methods with the common methods including thermal evaporation methods and solution process methods. Thermal evaporation methods are widely used for OLEDs, but they are more complex and have higher costs of fabrication as compared to solution process methods. Solution process methods are thus preferred as cheaper and simpler fabrication methods. In the fabrication of devices with these methods, it is important to find the appropriate solvents such that during the deposition of a layer, the process will not dissolve or otherwise damage the previously deposited layer. Such a non-damaging solvent is typically referred to in the art as "orthogonal" to the previous one (See, Organic Electronics 30 (2016) 18e29; http://dx.doi.org/10.1016/j.orgel.2015.12.008).

To include QLEDs in multicolor high-resolution displays, different manufacturing methods have been designed. These methods typically include depositing three different types of QDs on three different regions of a substrate such that each region emits light (through charge injection that causes electroluminescence) at three different colors, particularly red (R), green (G) and blue (B). Sub-pixels that respectively emit red, green, or blue light may collectively form a pixel, which in turn may be a part of an array of pixels of the display.

WO 2017/117994 (Li et al., published Jul. 13, 2017) describes that through external energy stimuli (e.g. pressure, temperature or UV irradiation), QDs which emit different colors can be selectively attached to bonding surfaces. Surfaces and ligands of QDs must contain particular ending functional groups (e.g. alkenes, alkynes, thiols) to be selectively strongly bonded to each other through chemical reactions. This concept is further expanded in WO 2017/121163 (Li et al., published Jul. 20, 2017), in which QDs with R, G and B emission colors can be patterned separately using cross-linkable ligands and organic connectors through chemical reactions that are activated selectively with UV radiation applied at different monochromatic wavelengths. Park et al., Alternative Patterning Process for Realization of Large-Area, Full-Color, Active Quantum Dot Display (Nano Letters, 2016, pages 6946-6953) describes that QDs with R, G and B emission colors are patterned by combining conventional photolithography and layer by layer assembly. Park describes the deposition of QD layers selectively on activated (i.e., charged) surfaces.

CN106374056A (X. Chao, published Jan. 2, 2017) describes a method where R, G and B subpixels can be patterned on a substrate with an array of electrodes, applying selectively a current to certain electrodes, after immersion in solutions of QDs of specific colors, QD layers are deposited selectively only on charged electrodes.

SUMMARY OF INVENTION

The present application relates to an enhanced structure of a layer including Quantum Dots (QDs) dispersed in a cross-linked material. A layer including QDs dispersed in a cross-linked material is resistant to solvent rinsing and may improve patterned layers in the QLED field. This can be generally called a cross-linked layer in which quantum dots are dispersed (CLQDL). In some embodiments, the quantum dots are dispersed in, but do not form a part of, the cross-linked network of the cross-linked layer. In other embodiments, the quantum dots are dispersed in, and form a part of, the cross-linked network of the cross-linked layer. In embodiments where the cross-linked material is a charge transport material (e.g., hole transport material or electron transport material), this layer may also be referred to as a combined charge transport and emissive layer (CCTEL) of a QLED. The CCTEL may improve performance of existing QLEDs and may simplify fabrication by combining properties of a charge transport layer and an emissive layer.

A CCTEL (CLQDL) may be formed from a solution including QDs, cross-linkable material (e.g., charge transport material), and a solvent by cross-linking the cross-linkable material with the QDs dispersed therein. In some embodiments, the cross-linkable material is crosslinked to form a cross-linked network in which the quantum dots are dispersed (but where the quantum dots do not form a part of the cross-linked network). In other embodiments, the cross-linkable material and the QDs are crosslinked to form a cross-linked network in which the quantum dots are dispersed (where the quantum dots form a part of the cross-linked network). The disposition of the QDs within the cross-linked material can be controlled by engineering the interactions between the different components of the QDs and the surrounding layers. Optionally this solution may include one or more initiators of the polymerization. The initiator can be defined based on an external stimulus that activates the initiator such as light, temperature, pressure, change in pH and the like.

In accordance with one aspect of the present disclosure, a light-emitting device includes: an anode; a cathode; and a combined charge transport and emissive layer disposed on a deposition surface between the anode and the cathode, the combined charge transport and emissive layer including crosslinked charge transport material and quantum dots, the quantum dots distributed unevenly within the crosslinked charge transport material and arranged relative to the deposition layer, wherein the quantum dots include nucleophilic or electrophilic centers and ligands respectively bonded to the quantum dots, and wherein the deposition surface has nucleophilic or electrophilic properties.

In some embodiments, the deposition surface includes chelating ligands.

In some embodiments, the deposition surface is a dithiol functionalized surface.

In some embodiments, the light-emitting device further includes an interlayer disposed in contact with the combined charge transport and emissive layer, wherein the deposition surface is a surface of the interlayer.

In some embodiments, at least 75% of the quantum dots are located in a half portion of the combined charge transport and emissive layer closest to the deposition surface, and at least a portion of the quantum dots are bonded to the deposition layer.

In some embodiments, at least 75% of the quantum dots are located in a half portion of the combined charge transport and emissive layer distal to the deposition surface.

In some embodiments, the deposition surface is a surface of the anode.

In some embodiments, the deposition surface is a surface of the cathode.

In some embodiments, the light-emitting device further includes an electron transport layer disposed between the anode and the cathode, wherein the deposition surface is a surface of the electron transport layer.

In some embodiments, the light-emitting device further includes a hole transport layer disposed between the anode and the cathode, wherein the deposition surface is a surface of the hole transport layer.

In some embodiments, the quantum dots include ligands having an electrophilic center and a nucleophilic center, and at least a portion of the ligands are bonded to the deposition surface.

In accordance with another aspect of the present disclosure, a bank structure of multiple light-emitting devices includes: a first light emitting device and a second light emitting device, each of the first and second light emitting devices being a light emitting device according to any of the above-described embodiments of the light-emitting device; an insulating material that separates at least a portion of the first light-emitting device from the second light emitting device; wherein the first light-emitting device and the second light-emitting device are configured to emit different wavelengths.

In accordance with another aspect of the present disclosure, a method of forming a combined charge transport and emissive layer of a light-emitting device includes the steps of: depositing a mixture on a deposition surface having nucleophilic or electrophilic properties, the mixture including: a solvent; cross-linkable charge transport material; and quantum dots including nucleophilic or electrophilic centers and ligands respectively bonded to the quantum dots; and subjecting at least a portion of the mixture to an activation stimulus to crosslink the cross-linkable material to form a crosslinked charge transporting material; wherein during at least one of the depositing and subjecting steps, the quantum dots are distributed unevenly within the crosslinked charge transport material and arranged relative to the deposition layer.

In some embodiments, the activation stimulus includes at least one of ultraviolet (UV) light exposure, heating, application of pressure, and pH change.

In some embodiments, the mixture further includes a photo initiator, and the activation stimulus includes exposure to UV light.

In some embodiments, the deposition surface includes chelating ligands.

In some embodiments, the deposition surface is a dithiol functionalized surface.

In some embodiments, at least 75% of the quantum dots are located in a half portion of the combined charge transport and emissive layer closest to the deposition surface, and at least a portion of the quantum dots are bonded to the deposition layer.

In some embodiments, wherein at least 75% of the quantum dots are located in a half portion of the combined charge transport and emissive layer distal to the deposition surface.

In some embodiments, the quantum dots include ligands having an electrophilic center and a nucleophilic center, and at least a portion of the ligands are bonded to the deposition surface.

To the accomplishment of the foregoing and related ends, the invention, then, includes the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

FIG. 3 is a drawing depicting a cross-section of a QD-LED structure in accordance with embodiments of the present application.

FIGS. 4A, 4B, 4C, 4D, 4E, 4F, and 4G are drawings depicting cross-sections of exemplary CCTELs 307 from FIG. 3 in accordance with embodiments of the present application.

FIG. 5A is a drawing depicting a cross-section of a standard QD-LED structure.

FIG. 5B is a drawing depicting a cross-section of an inverted QD-LED structure.

FIG. 5C depicts a standard QD-LED structure with a combined hole transporting and emissive layer in which QDs form a monolayer on top of the charge transporting material in accordance with embodiments of the present application.

FIG. 5D depicts an inverted QD-LED structure with a combined hole transporting and emissive layer in which QDs form a monolayer below the charge transporting material in accordance with embodiments of the present application.

FIG. 5E depicts a standard QD-LED structure with a combined electron transporting and emissive layer in which QDs form a monolayer below the charge transporting material in accordance with embodiments of the present application.

FIG. 5F depicts an inverted QD-LED structure with a combined electron transporting and emissive layer in which QDs form a monolayer on top of the charge transporting material in accordance with embodiments of the present application.

FIGS. 6A, 6B, 6C, and 6D depict a method to deposit a nucleophilic interlayer, which is a deposition surface to direct QDs towards the bottom of the CCTEL, and to deposit a CCTEL including cross-linkable charge transporting material and QDs, in accordance with embodiments of the present application.

FIGS. 7A, 7B, 7C, and 7D depict functionalization of the deposition surface with dangling nucleophilic centers, and to deposit a CCTEL including cross-linkable charge transporting material and QDs, in accordance with embodiments of the present application.

FIGS. 8A, 8B, 8C, and 8D depict deposition of an electrophilic interlayer, which is a deposition surface to directed QDs towards the bottom of the CCTEL, and to deposit a CCTEL including cross-linkable charge transporting material and QDs, in accordance with embodiments of the present application.

FIGS. 9A, 9B, 9C, and 9D depict functionalization of the deposition surface with dangling electrophilic centers, and to deposit a CCTEL including cross-linkable charge transporting material and QDs, in accordance with embodiments of the present application.

FIGS. 10A, 10B, 10C, and 10D depict a method to deposit a cross-linkable charge transporting material and QDs to a CCTEL, and to direct QDs towards the bottom during formation of the CCTEL in accordance with embodiments of the present application.

FIGS. 11A, 11B, 11C, and 11D depict a method to deposit a cross-linkable charge transporting material and QDs to a CCTEL, and to direct QDs towards the bottom during formation of the CCTEL in accordance with embodiments of the present application.

FIGS. 12A, 12B, 12C, 12D1, 12D2, and 12E depict a method to deposit a cross-linkable charge transporting material and QDs to a CCTEL, and to direct QDs towards the bottom during formation of the CCTEL in accordance with embodiments of the present application.

DESCRIPTION OF EMBODIMENTS

Figure 1B:
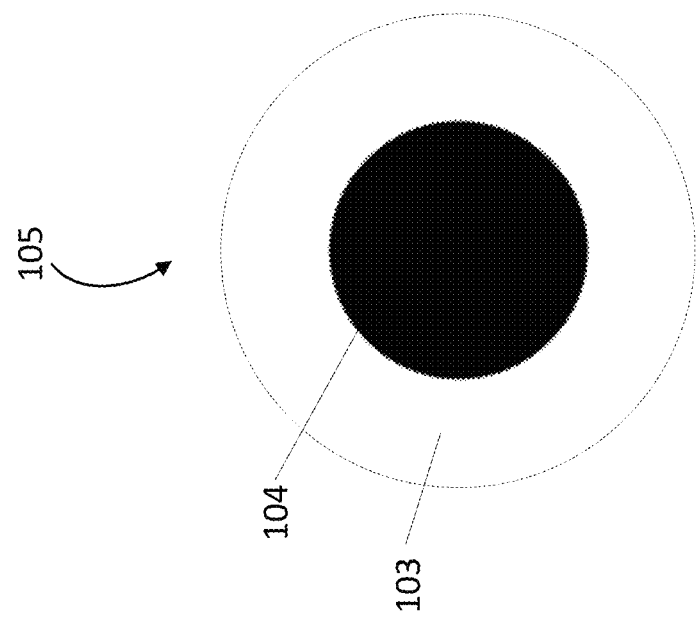
FIG. 1B depicts a schematic simplified version of FIG. 1A.

Embodiments of the present invention will now be described with reference to the drawings, wherein like reference numerals are used to refer to like elements throughout. It will be understood that the figures are not necessarily to scale.

Figure 1A:
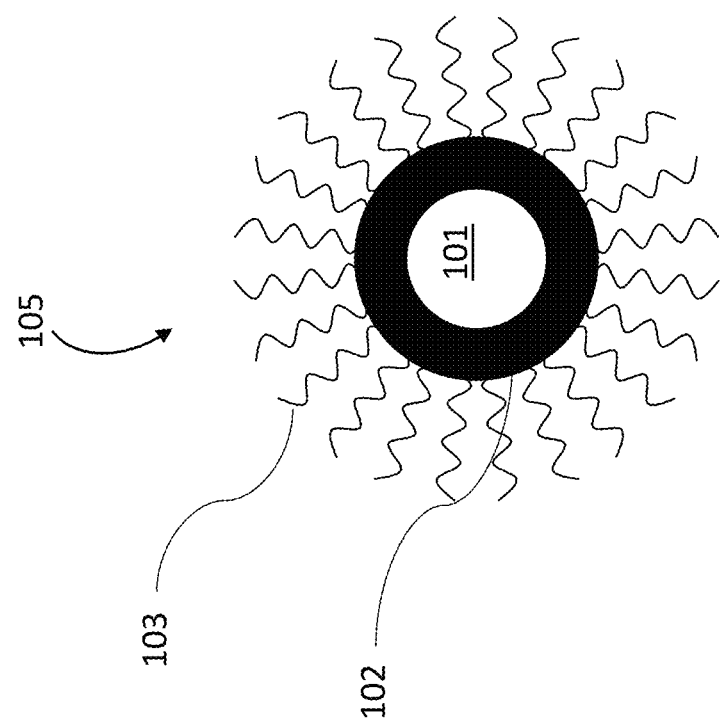
FIG. 1A depicts a two-dimensional schematic representation of a core-shell QD employed in an emissive layer.

FIG. 1A and FIG. 1B are drawings depicting a two-dimensional schematic representation of a core-shell QD 105. Multiple instances of the QD 105 may be employed in an emissive layer. The QDs may be configured as nanoparticles. FIG. 1A schematically shows that the QD may include a nanocrystalline core 101 that is co-crystallized with a shell 102 including a compatible material, which is then surrounded by ligands 103 that are bonded to the surface of the QD and that passivate crystal defects in the core-shell QD, i.e., core 101 and shell 102, and allow and improve solubility in common solvents. FIG. 1B is a schematic simplified version of FIG. 1A used for more convenient representation of QDs in a light-emitting device structure, depicting a generalized core-shell QD structure 104 surrounded by a region of ligands 103.

Exemplary QD core and shell materials include one or more of: InP, CdSe, CdS, CdSe$_x$S$_{1-x}$, CdTe, Cd$_x$Zn$_{1-x}$Se, Cd$_x$Zn$_{1-x}$Se$_y$S$_{1-y}$, ZnSe, ZnS, ZnS$_x$Te$_{1-x}$, ZnSe$_x$Te$_{1-x}$, perovskites of the form ABX$_3$, Zn$_w$Cu$_z$In$_{1+(w+z)}$S, and carbon, where 0≤w, x, y, z≤1.

The surface of a nanocrystalline quantum dot plays an important role in dictating its properties. Considering, for example, a standard metal-chalcogenide core-shell QD, the surface has incomplete crystalline structure (and thus defects). These atoms cannot have the same crystalline structure of the inner atoms; being on the surface, they cannot be completely surrounded by other atoms as happens inside the crystal. The surface, depending on the QD structure, on the synthesis method, and the like, can be metal rich (electrophilic) of chalcogenide rich (nucleophilic). The surface, including the defects, can be passivated bonding ligands.

Exemplary ligands 103 include alkyl, -alkenyl, -alkynyl or aryl (linear, branched or cyclic) thiols with 1 to 30 atoms of carbon; alkyl, -alkenyl, -alkynyl or aryl (linear, branched or cyclic) alcohols with 1 to 30 atoms of carbon; alkyl, -alkenyl, -alkynyl or aryl (linear, branched or cyclic) carboxylic acids with 1 to 30 atoms of carbon; tri-alkyl, -alkenyl, -alkynyl or aryl (linear, branched or cyclic) phosphine oxides with 1 to 60 atoms of carbon; alkyl, -alkenyl, -alkynyl or aryl (linear, branched or cyclic) amines with 1 to 30 atoms of carbon; salts formed from any of the above listed compounds (the anion or the cation are the binding moieties); halogen salts (the anion or the cation are the binding moieties). It will be appreciated that while the present disclosure primarily describes the QDs as core-shell QDs, in some embodiments the QDs may not be of the core-shell type or they may be of a core/multiple-shells type having more than one shell. The non-core-shell type QDs may be made from one or more of the above-mentioned materials, and the QDs in accordance with the present disclosure may not include a core-shell configuration.

Each of the ligands 103 and the QDs 104 (e.g., the core-shell or non-core-shell type) may contain electrophilic centers and/or nucleophilic centers. An electrophilic or nucleophilic center is the atom or chemical group that is intrinsically able to accept or donate a pair of electrons. This may allow the ligands and QDs to form bonds between each other. As an example, a core-shell nanocrystalline QD with a metal rich surface (electrophilic) can bond ligands with a nucleophilic center (e.g. oleic acid).

A ligand is an electrophilic species (electrophile) or nucleophilic species (nucleophile) that contains an electrophilic or nucleophilic center.

An electrophilic species (electrophile) is a chemical species that contains at least an electrophilic center that accepts an electron pair. It participates in a chemical reaction by accepting an electron pair in order to bond to a nucleophile. Electrophilic centers are positively charged or neutral atoms or functional groups having vacant orbitals that are attracted to an electron rich center. In organic chemistry, usually an electrophilic atom is a carbon which is bonded to an electronegative atom, usually oxygen, nitrogen, sulfur, or a halogen.

Major factors that affect electrophile strength or "electrophilicity" include one or more of steric effects, electron donating groups, and electron withdrawing groups. Steric effects include bulky species that are less electrophilic than analogous small species during $S_N2$ reactions. In $S_N1$ reactions electrophilicity depends on how easy it is to make a carbocation and how stable it is. Electron donating groups (EDG) stabilize a carbocation. Alkyl groups are weak EDG; stabilization has this order: tertiary>secondary>primary>methyl. EDG with resonance effect stabilize aromatic or conjugated carbocations. Heteroatoms of heterocyclic are electron withdrawing groups (EWG) with inductive effect, but they behave as EDG with resonance effect; depending on where the carbocation is in the cycle, it can be stabilized by resonance effect or destabilized by inductive effect. EWGs with only inductive effect destabilize a carbocation (e.g., carbonyls are EWGs with inductive effect and, if they are in alpha to the carbocation, they highly destabilize it).

Exemplary electrophilic centers include: cations such as $H^+$ and $NO^+$, polarized neutral molecules such as HCl, alkyl halides, acyl halides, and carbonyl compounds, polarizable neutral molecules such as $Cl_2$ and $Br_2$, oxidizing agents such as organic peracids, chemical species that do not satisfy the octet rule such as carbenes and radicals, and some Lewis acids such as $BH_3$ and DIBAL; and the like.

A nucleophilic species (nucleophile) is a chemical species that contains at least a nucleophilic center that donates an electron pair to form a chemical bond in relation to a reaction. All molecules or ions with a free pair of electrons or at least one double bond can act as nuclephilic centers.

Major factors that affect nucleophile strength or "nucleophilicity" are charge, periodic table trends, resonance effect, steric effects, and the like. For instance, negatively charged species are usually more nucleophilic than corresponding neutral species. To illustrate the effect of charge, a hydroxide ion is much more nucleophilic (and basic) than a water molecule because the negatively charged oxygen on the hydroxide ion carries greater electron density than the oxygen atom of a neutral water molecule.

Periodic table trends also affect nucleophile strength. For example, moving horizontally, from the right to the left across the second row of the periodic table, the nucleophilicity increases ($R_3C^->R_2N^->RO^->F^-$; with R=hydrocarbon group). In protic solvents (e.g., water, methanol), moving vertically from the bottom to the top across the periodic table, the nucleophilicity decreases (more basic species are more solvated with solvent and less efficient as nucleophile). In polar aprotic solvents (e.g. acetone, DMF, acetonitrile), moving vertically from the bottom to the top across the periodic table, the nucleophilicity increases (nucleophilicity has same trend of basicity). In apolar solvents nucleophiles are not usually soluble in these solvents.

Resonance effects also affect nucleophile strength. For example, if the electron lone pair on a heteroatom is delocalized by resonance, it is inherently less reactive—meaning less nucleophilic, and also less basic (e.g., the nitrogen atom on an amide is less nucleophilic than the nitrogen of an amine, due to the resonance stabilization of the nitrogen lone pair provided by the amide carbonyl group).

Steric effects also affect nucleophile strength. For example, bulky species are less nucleophilic than analogous small species (tert-butanol is less nucleophilic than methanol because the comparatively bulky methyl groups on the tertiary alcohol effectively block the route of attack by the nucleophilic oxygen, slowing its efficacy considerably).

Exemplary nucleophilic centers include: carboxylic acids, thiols, alcohols, amines, amides, esters, ethers, epoxides, enols, thiocyanites, isothiocyanites, thiolcarboxylic acids, dithiocarbonates, dithiocarbamates, oxetanes, diazonium salts, alkynes, alkenes, halogen salts, azides, nitrites, carbazides, conjugated bases of these, and the like.

The cross-linked material may be originated from the polymerization of a cross-linkable organic (or organo-metallic) material. One example of a cross-linkable material from which the structure described above may be formed is N4,N4'-Bis(4-(6-((3-ethyloxetan-3-yl)methoxy)hexyl)phenyl)-N4,N4'-diphenylbiphenyl-4,4'-diamine (OTPD), shown below in Formula 1. In some embodiments, the cross-linkable material shown in Formula 1 may be used in forming the matrix shown in the figures.

shown below in Formula 2. In some embodiments, the cross-linkable material shown in Formula 2 may be used in forming the matrix shown in the figures.

Formula 2

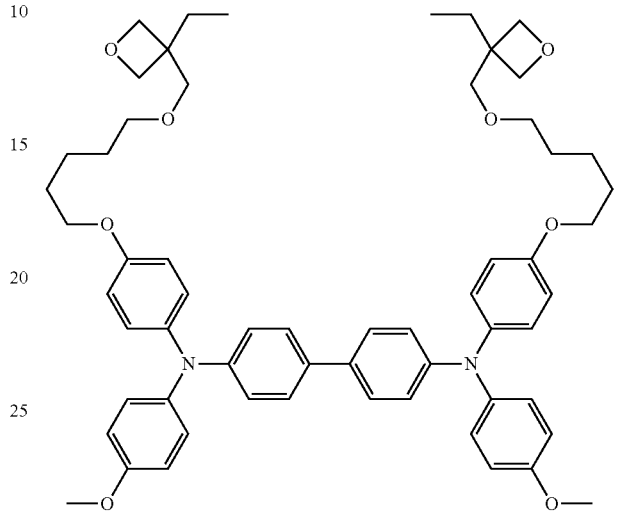

Another example of a cross-linkable material from which the structure described above may be formed is N,N'-(4,4'-(Cyclohexane-1,1-diyl)bis(4,1-phenylene))bis(N-(4-(6-(2-ethyloxetan-2-yloxy)hexyl)phenyl)-3,4,5-trifluoroaniline) (X-F6-TAPC), shown below in Formula 3. In some embodiments, the cross-linkable material shown in Formula 3 may be used in forming the matrix shown in the figures.

Formula 1

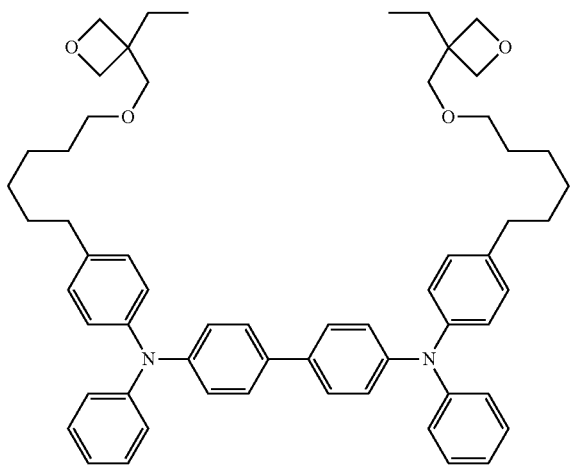

Another example of a cross-linkable material from which the structure described above may be formed is N4,N4'-Bis(4-(6-((3-ethyloxetan-3-yl)methoxy)hexyloxy)phenyl)-N4,N4'-bis(4-methoxyphenyl)biphenyl-4,4'-diamine (QUPD), Formula 3

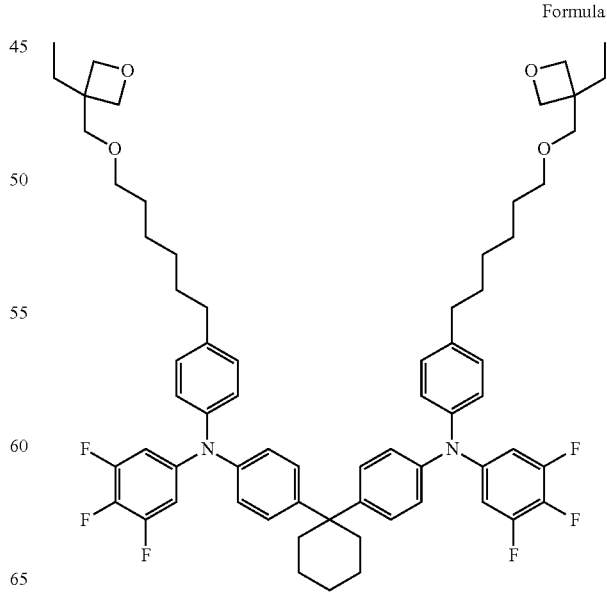

An example of a cross-linkable material from which the structure described above may be formed is N4,N4'-Di(naphthalen-1-yl)-N4,N4'-bis(4-vinylphenyl)biphenyl-4,4'-diamine (VNPB), shown below in Formula 4. In some embodiments, the cross-linkable material shown in Formula 4 may be used in forming the matrix shown in the figures.

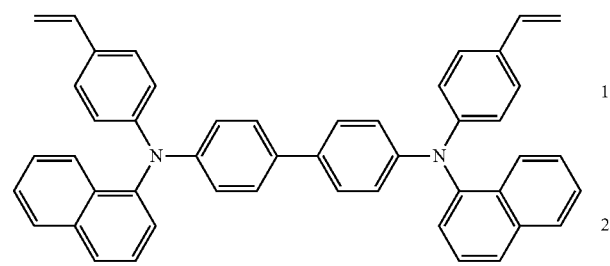

Another example of a cross-linkable material from which the structure described above may be formed is 9,9-Bis[4-[(4-ethenylphenyl)methoxy]phenyl]-N2,N7-di-1-naphthalenyl-N2,N7-diphenyl-9H-Fluorene-2,7-diamine (VB-FNPD), shown below in Formula 5. In some embodiments, the cross-linkable material shown in Formula 5 may be used in forming the matrix shown in the figures.

Formula 5

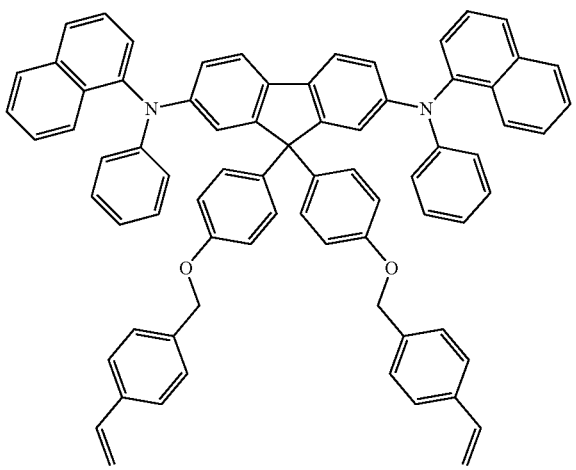

Another example or a cross-linkable material from which the structure described above may be formed is 3,5-di-9H-carbazol-9-yl-N,N-bis[4-[[6-[(3-ethyl-3-oxetanyl)methoxy]hexyl]oxy]phenyl]-benzenamine (Oxe-DCDPA), shown below in Formula 6. In some embodiments, the cross-linkable material shown in Formula 6 may be used in forming the matrix shown in the figures.

Formula 6

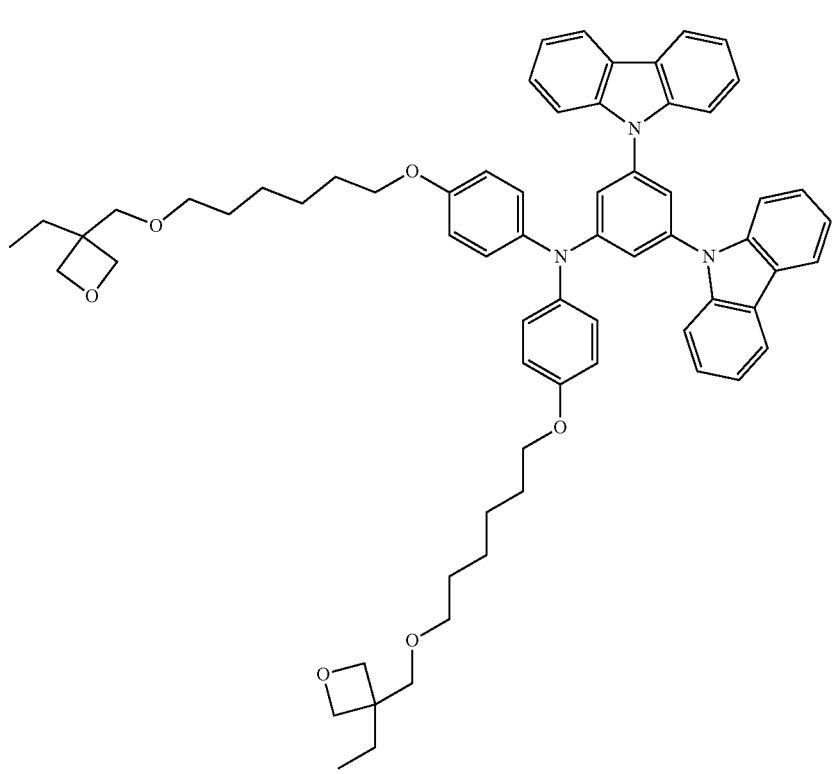

In some embodiments the emissive layer is formed using one or more photo-initiators in addition to the one or more types of cross-linkable materials and the one or more types of QDs. As such, the layer described in this application may include one or more photo-initiators. A photo initiator is a material that initiates polymerization in response to light stimuli. In some embodiments, the photo initiator may generate one or more radicals, ions, acids, and/or species that may initiate such polymerization. Photo initiators include sulfonium- and iodonium-salts (e.g., triphenylsulfonium triflate, diphenyliodonium triflate, iodonium, [4-(octyloxy)phenyl]phenyl hexafluorophosphate, bis(4-methylphenyl)iodonium hexafluorophosphate, diphenyliodonium hexafluoroarsenate, diphenyliodonium hexafluoroantimonate, etc.), chromophores containing the benzoyl group (benzoin ether derivatives, halogenated ketones, dialkoxyacetophenones, diphenylacetophenones, etc.), hydroxy alkyl heterocyclic or conjugated ketones, benzophenone- and thioxanthone-moiety-based cleavable systems (such as benzophenone phenyl sulfides, ketosulfoxides, etc.), benzoyl phosphine oxide derivatives, phosphine oxide derivatives, trichloromethyl triazines, biradical-generating ketones, peroxides, diketones, azides and aromatic bis-azides, azo derivatives, disulfide derivatives, disilane derivatives, diselenide and diphenylditelluride derivatives, digermane and distannane derivatives, peresters, Barton's ester derivatives, hydroxamic and thiohydroxamic acids and esters, organoborates, titanocenes, chromium complexes, aluminate complexes, tempo-based alkoxyamines, oxyamines, alkoxyamines, and silyloxyamines.

The solvent used may be any suitable solvent. For example, the solvent may be selected such that the QDs, the cross-linkable material, and a photo initiator are soluble therein. Exemplary solvents include, but are not limited to, one or more of the following: acetone, dichloromethane, chloroform, linear or branched alkyl acetates (e.g., ethyl acetate, n-butyl acetate, 2-butyl acetate), linear or branched alkanes with 3 to 30 atoms of carbon (e.g., pentane, hexane, heptane, octane, nonane, decane, undecane, dodecane), linear or branched alcohols with 1 to 20 atoms of carbon (e.g., butanol, 2-propanol, propanol, ethanol, methanol), linear or branched alkoxy alcohols with 2 to 20 atoms of carbon (e.g., 2-Methoxyethanol, 2-Ethoxyethanol), mono, di and tri halogen substituted benzenes (e.g., chlorobenzene, 1,2-dibromobenzene, 1,3-dibromobenzene, 1,4-dibromobenzene, 1,3,5-tribromobenzene, 1,2,4-tribromobenzene), linear or branched ethers with 2 to 20 atoms of carbon, and/or mono, di and tri alkyl substituted benzenes (e.g., toluene, 1,2-Dimethylbenzene, 1,3-Dimethylbenzene, 1,4-Dimethylbenzene), benzene, dioxane, propylene glycol monomethyl ether acetate (PGMEA), 1-methoxy-2-propanol. The solvent that is utilized may depend on the specific quantum dots, cross-linkable material, and photo initiator that are selected. QDs, ligands of the QDs, and cross-linkable material can be selected to create uniform dispersion in the deposition solvent. Materials with similar polarity indices can be selected to ensure homogeneity of the deposited mixtures.

Figure 2:
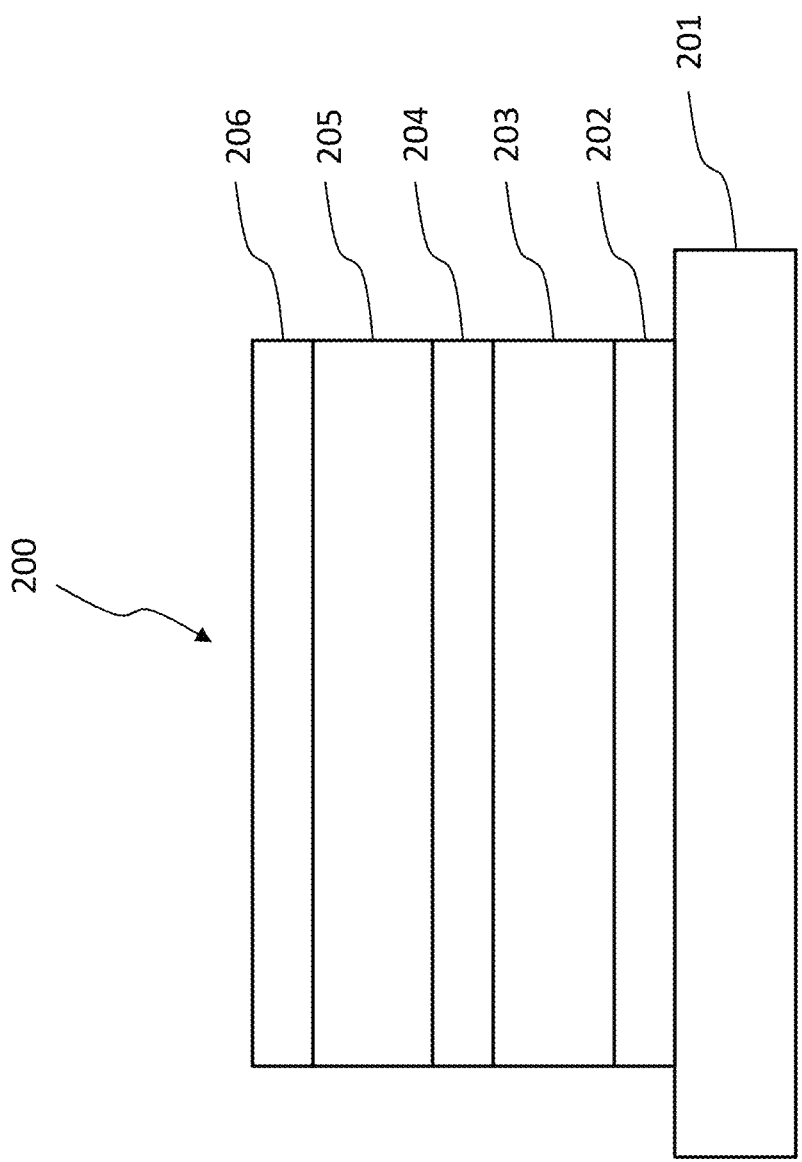
FIG. 2 is a drawing depicting a cross-section of a configuration of a conventional QD-LED structure.

FIG. 2 is a drawing depicting a cross-section of a configuration of a conventional QD-LED 200 structure. Several planar layers are disposed on a substrate 201, including: a first electrode 202; a second electrode 206; an emissive layer (EML) 204 disposed between the first electrode 202 and the second electrode 206; one or more first charge transport layers (CTL) 203 disposed between the first electrode 202 and the emissive layer 204; and one or more second charge transport layers 205 disposed between the second electrode 206 and the emissive layer 204. In some embodiments, the QD-LED structure may have a structure wherein the first electrode 202 is an anode, the one or more first charge transport layers 203 are hole transport layers (HTLs), the one or more second transport layers 205 are electron transport layers (ETLs), and the second electrode 206 is a cathode. This structure may be referred to as a "standard" structure. In other embodiments, the QD-LED structure may have an "inverted" structure wherein the first electrode 202 is a cathode, the one or more first charge transport layers 203 are ETLs, the one or more second transport layers 205 are HTLs, and the second electrode 206 is an anode. During operation, a bias is applied between the anode and the cathode. The cathode injects electrons into the adjacent CTL, and likewise the anode injects holes into the adjacent CTL. The electrons and holes propagate through the CTLs to the EML, where they radiatively recombine and light is emitted. A QD-LED may be described as "bottom-emitting" if light is primarily emitted out of the substrate 201 side, and a QD-LED may be described as "top-emitting" if light is primarily emitted out of the second electrode 206 side opposite from the substrate 201.

FIG. 3 is a drawing depicting a cross-section of a QD-LED structure 300 in accordance with embodiments of the present application. The light emitting device 300 includes a substrate 301, a first electrode 302, an optional one or more first charge transport layers 303, an optional one or more second charge transport layers 305, and a second electrode 306. Such layers may be configured and composed comparably as analogous layers of the conventional configuration of FIG. 2. In embodiments of the present application, in contrast to the conventional configuration, the light-emitting device 300 includes a combined charge transport and emissive layer (CCTEL) 307, which as further detailed below combines properties of a charge transport layer and an emissive layer. In some embodiments, although not specifically shown in FIG. 3, a layer may be provided between the one or more first charge transport layers 303 and the CCTEL (or between the first electrode 302 and the CCTEL in embodiments in which the one or more first charge transport layers 303 are omitted). The layer, which is described below and shown in subsequent figures, may be a thin layer of an organic or inorganic material, of nanoparticles, of pure metal(s) or alloys thereof.

The substrate 301 may be made from any suitable material(s) as are typically used in light-emitting devices, such as glass substrates and polymer substrates. More specific examples of substrate materials include polyimides, polyethenes, polyethylenes, polyesters, polycarbonates, polyethersulfones, polypropylenes, and/or polyether ether ketones. The substrate 301 may be any suitable shape and size. In exemplary embodiments, the dimensions of the substrate allow for more than one light-emitting device to be provided thereon. For example, a major surface of the substrate may provide an area for multiple light-emitting devices to be formed as sub-pixels of a pixel, with each sub-pixel emitting light of a different wavelength such as red, green, and blue. In another example, a major surface of the substrate may provide an area for multiple pixels to be formed thereon, each pixel including a sub-pixel arrangement of multiple light-emitting devices.

The electrodes 302 and 306 may be made from any suitable material(s) as are typically used in light-emitting devices. At least one of the electrodes is a transparent or semi-transparent electrode for light emission, and the other of the electrodes is a reflective electrode to reflect any internal light toward the light-emitting side of the device. In the case of a bottom-emitting device, the first electrode 302 will be transparent or semi-transparent. Typical materials for the transparent or semi-transparent electrode include indium-doped tin oxide (ITO), fluorine doped tin oxide (FTO) or indium-doped zinc oxide (IZO), aluminum-doped zinc-oxide (AZO), indium-doped cadmium-oxide, and the like. In the case of a top-emitting device, the first electrode 302 may be made of any suitable reflective metal such as silver. In bottom-emitting devices, the second electrode 306 is a reflective electrode. Typical materials used for the reflective electrode include metals such as aluminum or silver (cathodes for a conventional structure) and gold or platinum (anodes for an inverted structure). Top-emitting structures will use a semi-transparent second electrode 306 such as thin (e.g., less than 20 nm thick) silver, a metallic bilayer (e.g., 2 nm Aluminum and 15 nm Silver), a magnesium-silver alloy, or a silver nanowires layer. The electrodes 302, 306 may also be provided in any suitable arrangement. As an example, the electrodes 302, 306 may address a thin-film transistor (TFT) circuit.

The optional one or more first charge transport layers 303 and optional one or more second charge transport layers 305 may be made from any suitable material(s). In exemplary embodiments, the electron transport and/or electron injection layers may include individual or combinations of: ZnO, 8-quinolinolato lithium (Liq.), LiF, $Cs_2CO_3$, $Mg_xZn_{1-x}O$, $Al_xZn_{1-x}O$, $Ga_xZn_{1-x}O$, 2,2',2"-(1,3,5-benzinetriyl)-tris(1-phenyl-1-H-benzimidazole) (TPBi), $TiO_2$, $ZrO_2$, N4,N4'-Di(naphthalen-1-yl)-N4,N4'-bis(4-vinylphenyl)biphenyl-4,4'-diamine (VNPB), 9,9-Bis[4-[(4-ethenylphenyl)methoxy]phenyl]-N2,N7-di-1-naphthalenyl-N2,N7-diphenyl-9H-Fluorene-2,7-diamine (VB-FNPD), where $0 \leq x \leq 1$. The EML may include: QD nanoparticles which include one or more of: InP, CdSe, CdS, $CdSe_xS_{1-x}$, CdTe, $Cd_xZn_{1-x}Se$, $Cd_xZn_{1-x}Se_yS_{1-y}$, ZnSe, ZnS, ZnSTe, ZnSeTe, perovskites of the form $ABX_3$, $Zn_wCu_zIn_{1-(w+z)}S$, carbon, where $0 \leq w, x, y, z \leq 1$ and $(w+z) \leq 1$. In exemplary embodiments, the hole transport and/or hole injection layers may include individual or combinations of: poly(3,4-ethylenedioxythiophene):poly(styrenesulfonate) (PEDOT:PSS), poly(9,9-dioctylfluorene-co-N-(4-sec-butylphenyl)-diphenylamine) (TFB), poly(9-vinylcarbazole) (PVK), poly(N,N'-bis(4-butylphenyl)-N,N'-bisphenylbenzidine) (PolyTPD), $V_2O_5$, NiO, CuO, $WO_3$, $MoO_3$, 2,3,5,6-tetrafluoro-7,7,8,8-tetracyanoquinodimethane (F4TCNQ), 1,4,5,8,9,11-hexaazatriphenylenehexacarbonitrile (HATCN), N4,N4'-Bis(4-(6-((3-ethyloxetan-3-yl)methoxy)hexyl)phenyl)-N4,N4'-diphenylbiphenyl-4,4'-diamine (OTPD), N4,N4'-Bis(4-(6-((3-ethyloxetan-3-yl)methoxy)hexyloxy)phenyl)-N4,N4'-bis(4-methoxyphenyl)biphenyl-4,4'-diamine (QUPD), N,N'-(4,4'-(Cyclohexane-1,1-diyl)bis(4,1-phenylene))bis(N-(4-(6-(2-ethyloxetan-2-yloxy)hexyl)phenyl)-3,4,5-trifluoroaniline) (X-F6-TAPC), 3,5-di-9H-carbazol-9-yl-N,N-bis[4-[[6-[(3-ethyl-3-oxetanyl)methoxy]hexyl]oxy]phenyl]-benzenamine (Oxe-DCDPA).

The EML may be a cross-linked layer in which QDs are dispersed (CLQDL). In some embodiments, the quantum dots are dispersed in, but do not form a part of, the cross-linked network of the cross-linked layer. In other embodiments, the quantum dots are dispersed in, and form a part of, the cross-linked network of the cross-linked layer. In exemplary embodiments, the light-emitting device includes an anode, a cathode, and a CCTEL disposed between the anode and the cathode, the CCTEL including a crosslinked charge transport material and quantum dots. In exemplary embodiments, the cross-linkable material used in the formation of the CLQDL can be a charge transporting material. A CLQDL with a charge transporting material can be a combined charge transporting and emissive layer (CCTEL). It will be appreciated that while reference may be made in the disclosure to one of a CLQDL or CCTEL, the disclosure associated with such reference may equally apply to the non-referenced term.

In various embodiments, the quantum dots are distributed unevenly within the crosslinked charge transport material. As described herein, an uneven distribution refers to a state in which the QDs are not uniformly distributed throughout the layer, such that a concentration of QDs in a given area or volume of the layer is different from one or more other areas or volumes of the layer.

For example, the quantum dots may be segregated within the crosslinked charge transport material whereby the quantum dots are predominantly or completely located in a half portion of the CCTEL closest to the cathode (e.g., upper half or lower half of the CCTEL, depending on the structure of the device), and may form a layer, monolayer, clusters, or other groupings of quantum dots in the half portion of the CCTEL closest to the cathode (e.g., at, proximate, and/or adjacent to an outer surface of the CCTEL closest to the cathode). As another example, the quantum dots may be segregated within the crosslinked charge transport material whereby the quantum dots are predominantly or completely located in a half portion of the CCTEL closest to the anode (e.g., upper half or lower half of the CCTEL, depending on the structure of the device), and may form a layer, monolayer, clusters, or other groupings of quantum dots in the half portion of the CCTEL closest to the anode (e.g., at, proximate, and/or adjacent to an outer surface of the CCTEL closest to the anode). In some embodiments, at least 75% of the quantum dots are located in a half portion of the CCTEL closest to the deposition surface on which the CCTEL is formed (e.g., closest to the electrode 302). In other embodiments, at least 85% of the quantum dots are located in a half portion of the CCTEL closest to the deposition surface on which the CCTEL is formed (e.g., closest to the electrode 302). In other embodiments, at least 95% of the quantum dots are located in a half portion of the CCTEL closest to the deposition surface on which the CCTEL is formed (e.g., closest to the electrode 302). In some embodiments, at least 75% of the quantum dots are located in a half portion of the CCTEL distal to the deposition surface on which the CCTEL is formed (e.g., closest to the electrode 306). In other embodiments, at least 85% of the quantum dots are located in a half portion of the CCTEL distal to the deposition surface on which the CCTEL is formed (e.g., closest to the electrode 306). In other embodiments, at least 95% of the quantum dots are located in a half portion of the CCTEL distal to the deposition surface on which the CCTEL is formed (e.g., closest to the electrode 306).

In another example, the quantum dots may be segregated within the crosslinked charge transport material whereby the quantum dots are present in distinct pairs and/or clusters randomly distributed within the CCTEL. In some embodiments, at least 75% of the quantum dots are provided in pairs and/or clusters. In other embodiments, at least 85% of the quantum dots are provided in pairs and/or clusters. In other embodiments, at least 95% of the quantum dots are provided in pairs and/or clusters.

The quantum dots may be segregated within the crosslinked material at least in part during the deposition process as the solvent in the mixture containing the quantum dots and the cross-linkable material evaporates. Additionally or alternatively, the quantum dots may be segregated within the crosslinked material at least in part in response to the activation stimulus, such as in response to exposure to UV light. Accordingly, the precise timing and nature of the segregation may vary among embodiments. The term segregated, as used herein, is a state in which the QDs and the crosslinked (or cross-linkable) material is separated into two distinct phases. It will be understood that the QDs are not soluble in the cross-linkable material, and that segregated as used herein is distinguished from the state in which the QDs are homogeneously (or near homogeneously) dispersed in the CCTEL. A given phase may be contiguous, or may be two or more separate parts dispersed in the other phase.

The CCTEL 307 includes a charge transport material and emissive quantum dots in which holes and electrons recombine to emit light. The charge transport material is chemically cross-linked. In exemplary embodiments, the quantum dots are distributed unevenly throughout the charge transport material of the CCTEL 307. Such distribution may be that which is described above with respect to the CLQDL.

FIGS. 4A-4G are drawings depicting cross-sections of an exemplary CCTEL 307 from FIG. 3 in accordance with embodiments of the present application. FIGS. 4B-4G illustrate exemplary embodiments of uneven quantum dot distribution within the CCTEL. The CCTEL 307 may be deposited on an underlayer 403 as shown in FIGS. 4A-4G. The underlayer 403 may be a substrate, an electrode, an interlayer, or a CTL. In each of FIGS. 4A-4G, quantum dots 401 are disposed within a cross-linked charge transport material 402. As referenced above, the quantum dot distribution within the cross-linked charge transport material is uneven, which may provide enhanced light-emitting efficiency in certain applications. The distribution of the quantum dots 401 within the cross-linked charge transport material 402 may be varied as follows as may be suitable for the requirements of any particular application. The distribution of the quantum dots in the CCTEL 307 may be obtained by segregation during a process used to deposit and form the CCTEL 307 layers, as further detailed in connection with the description below of a suitable fabrication method.

FIG. 4A illustrates an exemplary CCTEL 307 in which the quantum dots 401 are distributed randomly and surrounded by the cross-linked charge transport material 402. In some embodiments they may form clusters 404 of three or more QDs. In some embodiments, the random dispersion may also include individual and/or pairs of QDs dispersed within the cross-linked charge transport material 402.

FIG. 4B illustrates an exemplary CCTEL 307 in which the quantum dots 401 are distributed predominately in the upper half portion 405 of the CCTEL 307, i.e., in the half of the CCTEL layer thickness that is distal the underlayer 403. As shown, the distribution may include clusters of three or more QDs. In some embodiments, the distribution may also include individual and/or pairs of QDs. The clusters, pairs, and/or individual QDs may be arranged such that QDs are at, adjacent, and/or proximate to at least a portion of the upper outer surface of the CCTEL layer distal the underlayer 403.

FIG. 4C illustrates an exemplary CCTEL 307 in which the quantum dots 401 are distributed at least partially within the CCTEL 307 primarily at or adjacent to the upper outer surface 406 of the CCTEL 307, i.e. the surface distal the underlayer 403. The QDs may form a layer at the surface distal the underlayer 403. While the exemplary embodiment shown in FIG. 4C shows a layer of uniform thickness, in other embodiment, the thickness of the layer may vary over at least a portion of the layer.

In a variation shown in FIG. 4D, in an exemplary embodiment the quantum dots 401 may form a monolayer 407 (i.e., a single layer) located at least partially within the CCTEL 307 at or adjacent to said upper outer surface 406 of the CCTEL 307.

FIG. 4E illustrates an exemplary CCTEL 307 in which the quantum dots 401 are distributed predominately in the lower half portion 408 of the CCTEL 307, i.e. in the half of the CCTEL layer thickness that is closest to the underlayer 403. As shown, the distribution may include clusters of QDs. In some embodiments, the distribution may also include individual and/or pairs of QDs. The clusters, pairs, and/or individual QDs may be arranged such that QDs are at, adjacent, and/or proximate to at least a portion of the lower outer surface of the CCTEL layer proximate the underlayer 403.

FIG. 4F illustrates an example CCTEL 307 in which the quantum dots 401 are distributed at least partially within the CCTEL 307 primarily at or adjacent to the lower outer surface 409 of the CCTEL 307, i.e. the surface which forms an interface with the underlayer 403. The QDs may form a layer at the surface proximate the underlayer 403. While the exemplary embodiment shown in FIG. 4E shows a layer of uniform thickness, in other embodiment, the thickness of the layer may vary over at least a portion of the layer.

In a variation shown in FIG. 4G, in an exemplary embodiment the quantum dots 401 may form a monolayer 410 located at least partially within the CCTEL 307 at or adjacent to said lower outer surface 409 of the CCTEL 307.

Referring again to the layered device structure depicted in FIG. 3 in combination with the CCTEL structures of FIGS. 4A-4G, an example of a light emitting device 300 is configured as a structure in which the first electrode 302 is the anode that injects holes, the second electrode 306 is the cathode that injects electrons, and the CCTEL 307 has hole transporting properties. Such a device including a CCTEL may be configured as follows: a substrate 301; a first electrode 302 which is an anode; an optional one or more first charge transport layers 303 which are hole transport layers; a CCTEL 307 in which the charge transport material is a hole transport material and the quantum dots are distributed as illustrated in one of FIGS. 4A-4G; one or more second charge transport layers 305 which are electron transport layers; and a second electrode 306 which is a cathode.

The one or more first charge transport layers 303 in this example are optional because the charge transport material in the CCTEL has hole transporting properties. When a mixture including a cross-linkable charge transporting material and QDs is deposited, QDs can be segregated to the top or bottom of the charge transporting material. Additional description related to QD segregation is provided in U.S. patent application Ser. No. 16/519,329, filed on Jul. 23, 2019, the disclosure of which is hereby incorporated by reference in its entirety for all purposes.

FIGS. 5A and 5B are drawings depicting the cross-section of a standard QD-LED structure, and an inverted QD-LED structure, respectively, in which the QDs form a separate emissive layer. In FIGS. 5A and 5B, EML includes colloidal QDs. For the purposes of illustration, FIGS. 5C-5F depict exemplary positions for the QDs within a CCTEL for the different QD-LED structures. FIG. 5C depicts a standard structure with a combined hole transporting and emissive layer in which QDs form a monolayer at the upper outer surface of the CCTEL. FIG. 5D depicts an inverted structure with a combined hole transporting and emissive layer in which QDs form a monolayer at the lower outer surface of the CCTEL. FIG. 5E depicts a standard structure with a combined electron transporting and emissive layer in which QDs form a monolayer at the lower outer surface of the CCTEL. FIG. 5F depicts an inverted structure with a combined electron transporting and emissive layer in which QDs form a monolayer at the upper outer surface of the CCTEL.

While FIGS. 5C-5F depict exemplary positions of QDs, in other embodiments, the QDs may have a different arrangement. Exemplary reference is made to FIGS. 4A-4G. One of ordinary skill in the art would recognize many other variations, modifications, and alternatives.

As shown in FIGS. 5C-5F, a CCTEL may be deposited on a "deposition surface" 502. The deposition surface 502 can be the surface of an electrode, a surface of the ETL/EIL or HTL/HIL, an interlayer such as a thin layer of an organic or inorganic material, an interlayer such as a thin layer of nanoparticles, an interlayer such as a thin layer of pure metal(s) or alloys thereof, and the like. In some embodiments in which an interlayer is included, the thickness of the interlayer ranges from 1 nm to 100 nm. In other embodiments in which an interlayer is included, the thickness of the interlayer ranges from 1 nm to 50 nm. In other embodiments in which the interlayer is included, the thickness of the interlayer ranges from 1 nm to 20 nm.

When a CCTEL is deposited on the deposition surface 502 in FIGS. 5C-5F, the QDs may be directed/arranged in one of the above-described arrangements within the charge transporting material using one or a combination of arrangement approaches. In a first approach, the deposition surface 502 is functionalized beforehand and QDs are directed to a specific position when the CCTEL is deposited. This first approach includes functionalization of the material at upper outer portion of the deposition layer, and deposition of a thin layer of an already functionalized material. In a second approach, the CCTEL is deposited on the deposition surface 502 that can be functionalized or not, and with an external stimulus, the QDs are directed to a specific position. Using proper combinations of attraction and/or repulsion forces (between the QDs and the deposition surface) the segregation of QDs can be directed in the desired direction.

In the following examples, structures are described where the deposition surface 502 is functionalized before deposition of and QDs segregate below the charge transporting material.

FIG. 6A-6D depict a method to deposit a nucleophilic interlayer on the deposition surface to direct QDs towards the bottom of the CCTEL in accordance with embodiments of the present application. FIG. 6A depicts a substrate 601 that may be an LED structure such as an electrode, a charge transporting material, and the like. FIG. 6B depicts a nucleophilic interlayer 602 formed on the deposition surface 502 of the substrate 601. FIG. 6C depicts a combined charge transport and emissive mixture 606 deposited on the nucleophilic interlayer 602. The combined charge transport and emissive mixture 606 includes a solvent 605, a crosslinkable charge transporting material 604, and QDs 603. FIG. 6D depicts the final structure of the CCTEL 608 with a first portion (i.e., an upper half portion) including the crosslinked matrix 607 and a second portion (i.e., a lower half portion) including the QD layer 609. The QD layer 609 may be a monolayer of QDs. In some embodiments, the combined charge transport and emissive mixture 606 deposited (FIG. 6C) includes electrophilic QDs 603 that are attracted to species with a negative polarity, i.e., the thin layer of a nucleophilic material deposited to functionalize the deposition surface 502 of the substrate 601 to form the nucleophilic interlayer 602. In this embodiment the QDs 603 are more affine to the nucleophilic interlayer 602 than to their original ligands. As a result, the QDs 603 tend to segregate within the crosslinkable charge transporting material 604, undergoing ligand exchange and forming a QD layer 609 in the proximity of the nucleophilic interlayer 602. (A specific example can be dangling chelating ligands). In other embodiments, the QDs have ligands with one electrophilic and one nucleophilic center, disposed at the two extremities with the nucleophilic center bond to the core-shell QD and the electrophilic center direct at the extern of the core-shell-ligand QD. As a result, these QDs tend to segregate within the cross-linkable charge transporting material, with the electrophilic center of the ligands interacting (bond formation) with the nucleophilic interlayer, forming a QD layer in the proximity of the nucleophilic interlayer. Optionally an initiator may be present and the phase segregation can be activated with an external stimulus.

FIG. 7A-7D depict functionalization of the deposition surface with dangling nucleophilic centers in accordance with embodiments of the present application. FIG. 7A depicts a substrate 701 that may be an LED structure such as an electrode, a charge transporting material, and the like. FIG. 7B depicts the nucleophilic functionalization 702 of the deposition surface 502 on the substrate 701. The nucleophilic functionalization 702 of the deposition surface 502 of the substrate 701 may in some embodiments be accomplished with dangling nucleophilic centers 702 (following one of the methods listed below). FIG. 7C depicts a combined charge transport and emissive mixture 706 deposited on the nucleophilic functionalized deposition surface 702. The combined charge transport and emissive mixture 706 includes a solvent 705, a crosslinkable charge transporting material 704, and QDs 703. FIG. 7D depicts a CCTEL 708 with a first portion (i.e., an upper half portion) including the crosslinked matrix 707 and a second portion (i.e., a lower half portion) including QD layer 709 in the proximity of the functionalized surface 702. In some embodiments, the QDs 703 are electrophilic and are attracted to species with a negative polarity. If the QDs 703 are more affine to the dangling nucleophilic centers 702 deposited than to their original ligands, they tend to segregate within the charge transporting material 704, undergoing ligand exchange and forming the QD layer 709 in the proximity of the nucleophilic functionalization 702 of the substrate 701. (A specific example can be dangling chelating ligands). In other embodiments, the QDs have ligands with one electrophilic and one nucleophilic center, disposed at the two extremities with the nucleophilic center bond to the core-shell QD and the electrophilic center direct at the extern of the core-shell-ligand QD. As a result, these QDs tend to segregate within the cross-linkable charge transporting material, with the electrophilic center of the ligands interacting (bond formation) with the nucleophilic functionalization of the deposition surface, forming a QD layer in the proximity of the nucleophilic functionalization of the deposition surface. Optionally an initiator may be present and the phase segregation can be activated with an external stimulus.

FIG. 8A, 8B, 8C, 8D depict deposition of an electrophilic interlayer on the deposition surface in accordance with embodiments of the present application. FIG. 8A depicts a substrate 801 that may be an LED structure such as an electrode, a charge transporting material, and the like. FIG. 8B depicts an electrophilic interlayer 802 deposited on the deposition surface 502 of substrate 801. FIG. 8C depicts a combined charge transport and emissive mixture 806 deposited on the electrophilic interlayer 802. The combined charge transport and emissive mixture 806 includes a solvent 805, crosslinkable charge transporting material 804, and nucleophilic QDs that are attracted to species with a positive polarity. The QDs 803 may include double functionalized nucleophilic ligands (e.g., dithiols, di carboxylic acids). To form the CCTEL 808 shown in FIG. 8D, QDs 803 tend to segregate within the charge transporting material 804 and to form a first portion (i.e., an upper half portion) including the crosslinked matrix 807 and a second portion (i.e., a lower half portion) including a QD layer 809 in the proximity of the electrophilic interlayer 802.

FIG. 9A, 9B, 9C, 9D depict functionalization of the deposition surface with dangling electrophilic centers in accordance with embodiments of the present application. FIG. 9A depicts a substrate 901 that may be an LED structure such as an electrode, a charge transporting material, and the like. FIG. 9B depicts the electrophilic functionalization 902 of the deposition surface 502 on the substrate 901. The electrophilic functionalization of the deposition surface 502 of the substrate 901 may be accomplished with dangling electrophilic centers 902 (following one of the methods listed below). FIG. 9C depicts a combined charge transport and emissive mixture 906 deposited on electrophilic functionalized 902 deposition surface 502. The combined charge transport and emissive mixture 906 includes a solvent 905, a crosslinkable charge transporting material 904, and nucleophilic QDs 903 that are attracted to species with a specific polarity (e.g., positive). The nucleophilic QDs 903 may include double functionalized nucleophilic ligands 903 (e.g. dithiols, di carboxylic acids). FIG. 9D depicts a CCTEL 908 with a first portion (i.e., an upper half portion) including the crosslinked matrix 907 and a second portion (i.e., a lower half portion) including a QD layer 909. QDs 903 tend to segregate within the charge transporting material 904 and to form the QD layer 909 in the proximity of the electrophilic functionalized 902 deposition surface 502.

In alternative embodiments, charge separation can occur also in the opposite direction, with QDs on the top outer surface of the layer of the crosslinked material, i.e., an upper half portion. In one embodiment, QDs are attracted to species with a positive polarity and a thin layer of a nucleophilic material is deposited on the deposition surface. Successively, a CCTEL with QDs characterized by negative polarity is deposited. QDs tend to segregate within the charge transporting material and are directed by repulsive electrostatic forces on the top outer surface of the layer of the crosslinked material. In another embodiment, QDs are attracted to species with a negative polarity and a thin layer of an electrophilic material is deposited on the deposition surface. Successively, a CCTEL with QDs characterized by positive polarity is deposited. QDs tend to segregate within the charge transporting material and are directed by repulsive electrostatic forces on the top outer surface of the layer of the crosslinked material, i.e., an upper half portion.

Deposition of a charged interlayer or functionalization of the deposition surface can be achieved using any suitable method as are known in the art. Various exemplary deposition methods are described below.

Physical deposition methods such as evaporative coating, sputtering, and the like. Solution deposition methods such as spin coating, printing, dip coating, chemical vapor deposition, and the like. UV-Ozone treatment to provide a reduction of hydrophobic contaminants (these can be adsorbed if the surface is left free in air) of an exposed surface. Plasma treatment in which organics and polymers (as polyethylene and polypropylene) that are devoid of functional groups have been treated with a water plasma to give hydrophilic surfaces (hydroxyl groups formed). Electrochemical treatment, for example, after reduction of the surface with an electrode, the functionalization of the surface can be achieved using an active redox couple in different conditions (e.g., carbonyl or carboxyl groups in presence of air; nitro or bromo phenyl groups in the presence of 4-nitro or 4-bromo benzene diazonium). Chemical oxidation by strong acid such as piranha or chromic acid; $KMnO_4$ or $KMnO_4/H_2SO_4$ mixtures. Chemical reduction of polymers containing ester or ketone functionalities in the chain that can be modified by reduction. For example, they can be reduced by $NaBH_4$ or $LiAlH_4$. The $OH^-$ functions obtained on the surface can be further functionalized with additional reactions. Hydrolysis or aminolysis, for example, organics with ester groups can be hydrolyzed with NaOH to give a surface with —$COO^-$ or —COOH terminal groups, depending on further reprotonation with acetic acid. Reaction with ethylenediamine can leave hydroxyl and amino groups on the surface. Reaction with 3-aminopropyltriethoxysilane can leave a high concentration of silanol groups on the surface.

Further methods for deposition of a charged interlayer or functionalization of the deposition surface include reactions with radicals, carbenes, and nitrenes. These can be produced from different species and can react directly (homolytic dediazonation of diazonium salts) or indirectly (radical crossover reaction from a sterically hindered aryl radical that cannot react with surfaces but abstracts a halogen atom from an alkyl halide) with the surfaces. Solution depositing (with any of the suitable methods) a mixture of a charge transporting material with a material containing specific electrophilic or nucleophilic groups. Solution depositing (with any of the suitable methods) a mixture of a charge transporting material with a material with multiple electrophilic or nucleophilic groups (chelating material). One of ordinary skill in the art would recognize many variations, modifications, and alternatives.

In addition, or as an alternative to functionalization, an external stimulus can be used to direct the QDs to an arrangement within the charge transporting material.

An exemplary method of external stimulus includes electrochemical stimulus. Colloidal particles suspended in a liquid medium migrate under the influence of an electric field (electrophoresis deposition, EPD) and are deposited onto an electrode. All colloidal particles that can be used to form stable suspensions and that can carry a charge can be used in electrophoretic deposition. This includes materials such as polymers, nanoparticles, pigments, dyes, ceramics and metals. During the EPD process itself, direct current is applied to a solution of organics with ionizable groups (e.g., polymers, etc.) or a colloidal suspension of organics with ionizable groups which may also incorporate solid materials such as nanoparticles and pigments. The ionizable groups incorporated into the organics are formed by the reaction of an acid and a base to form a salt. The particular charge, positive or negative, which is imparted to the organics depends on the chemical nature of the ionizable group. If the ionizable groups on the organics are acids, the organics will carry a negative charge when salted with a base. If the ionizable groups on the organics are bases, the organics will carry a positive charge when salted with an acid.

There are two types of EPD processes, anodic and cathodic. In the anodic process, negatively charged material is deposited on the positively charged electrode, or anode. In the cathodic process, positively charged material is deposited on the negatively charged electrode, or cathode. Materials can be deposited also on conductive materials deposited on an electrode if they transport the same charge of the electrode.

Another method of external stimulus includes stimulus via light. Light can activate or direct particles by initiating specific reactions between dispersed particles and functionalized surfaces.

Another method of external stimulus includes magnetic stimulus. A magnetic field can direct or trigger the deposition of magnetic particles in specific surfaces.

Another method of external stimulus includes stimulus via pH variation. Change in pH can activate precipitation and then deposition of particles in suspension. Also, pH variation can activate or direct particles by initiating specific reactions between dispersed particles and functionalized surfaces.

Another method of external stimulus includes temperature stimulus. Change in temperature can activate or initialize reactions between QDs (or the ligands of them) and functionalized surfaces. Gradients of temperature can create internal convection fluxes that can direct particles in specific directions.

FIG. 10A, 10B, 10C, 10D depict an exemplary method to deposit a cross-linkable charge transporting material and QDs in a layer that may form the CCTEL, and to direct QDs towards the bottom of the layer in accordance with embodiments of the present application. First, in FIG. 10A, a substrate 1001 is provided. The substrate 1001 may be an LED structure such as an electrode, a charge transporting material, and the like. Next, FIG. 10B depicts dangling ligands 1002 linked to the deposition surface 1012, the dangling ligands 1002 having a higher affinity (e.g. chelating ligands) to a surface of exemplary QDs than the ligands initially provided at the surface of the QD. As shown, the shell of the QD may be bonded to the deposition surface (i.e., to the dangling ligands linked to the deposition surface). The deposition surface 1012 may be a dithiol functionalized substrate (i.e., chelating site).

FIGS. 10C and 10D depict the deposition of the CCTEL 1008. First, FIG. 10C depicts the deposition of a combined charge transport and emissive mixture 1006. The deposited combined charge transport and emissive mixture 1006 includes a solvent 1004, a crosslinkable material 1003, and QDs 1005. The QDs 1005 may include ligands (e.g., thiol monodentate ligands). The QDs 1005 are attracted to the deposited ligands where ligand exchange may occur. FIG. 10D depicts the QDs 1005 disposed close to the deposition surface 1012 and linked to it through chemical bonds or electrostatic forces. A chelating or multidentate ligand, such as those linked to deposition surface 1012, is a ligand that has more than one binding functionality that is able to coordinate one site. The chelate effect is the enhanced affinity of chelating ligands for a binding site compared to the affinity of a collection of similar nonchelating (monodentate) ligands for the same site. Therefore, as shown in FIG. 10D, the QDs 1005 bind to the chelating ligands linked to the deposition surface 1012. One of ordinary skill in the art would recognize variations, modifications, and alternatives.

In another embodiment, FIG. 11A, 11B, 11C, 11D depict a method to deposit a cross-linkable charge transporting material and QDs to a CCTEL, and to direct QDs towards the bottom of the CCTEL in accordance with embodiments of the present application. FIG. 11A depicts providing a substrate 1101. The substrate 1101 may be an LED structure such as an electrode, a charge transporting material, and the like. FIG. 11B depicts the functionalization of a deposition surface 1111 on the substrate 1101. In an exemplary embodiment, the substrate 1101 may be functionalized with a reactive group C 1102. Next, FIG. 11C depicts a combined charge transport and emissive mixture 1106 including a cross-linkable material 1103, a solvent 1104, and quantum dots 1105 deposited on the deposition surface 1111. The QDs 1105 have bifunctional ligands 1110, with one functionality A that has affinity to the surface of the QDs 1105 and one functionality B that can react with a third functionality C to form a bond. FIG. 11D depicts dangling organics with specific functional groups C linked to the deposition surface 1111. When the CCTEL is deposited, QDs 1105 are directed to the deposition surface 1111 and functionality B reacts with functionality C to form a bond D that positions QDs 1105 close to the deposition surface 1111. Exemplary functional groups A may be ligands such as thiols, carboxylic acids, amines, phosphine oxides, salts thereof, and the like. Exemplary functional groups B and C include, but are not limited to, combinations of the following: oxetane, epoxy, thiol, alkene, alkyne, ketone, azide, and aldehyde units. One of ordinary skill in the art would recognize variations, modifications, and alternatives.

In another exemplary embodiment, the solution that originates the CCTEL contains a photoinitiator. In this embodiment, the reaction between functionality B and C is initiated with a light stimulus.

In another exemplary embodiment, the reaction between functionality B and C is initiated with a change of pH.

In one exemplary embodiment, the solution that originates the CCTEL contains a catalyst. In this embodiment, the reaction between functionality B and C is facilitated (promoted) by the presence of the catalyst.

In one exemplary embodiment, the reaction between functionality B and C is initiated with a change of temperature.

The segregation of QDs can be directed in the desired direction using proper combinations of attraction and/or repulsion forces (i.e., between the QDs and the deposition surface). Exemplary materials that may be used in the device are described below.

Exemplary nucleophilic centers include: carboxylic acids, thiols, alcohols, amines, amides, esters, ethers, epoxides, enols, thiocyanites, isothiocyanites, thiolcarboxylic acids, dithiocarbonates, dithiocarbamates, oxetanes, diazonium salts, alkynes, alkenes, halogen salts, azides, nitrites, carbazides, conjugated bases of these, and the like.

Exemplary electrophilic centers include: cations such as $H^+$ and $NO^+$, polarized neutral molecules such as HCl, alkyl halides, acyl halides, and carbonyl compounds, polarizable neutral molecules such as $Cl_2$ and $Br_2$, oxidizing agents such as organic peracids, chemical species that do not satisfy the octet rule such as carbenes and radicals, and some Lewis acids such as $BH_3$ and DIBAL; and the like.

Exemplary chelating materials that can be used in these embodiments are: pentaerythritol tetrakis(3-mercaptopropionate) (PETMP); trimethylolpropane tris(3-mercaptopropionate) (TMPMP); 2,2'-(ethylenedioxy)diethanethiol; Tris [2-(3-mercaptopropionyloxy) ethyl]isocyanurate (TEMPIC); 1,3,5-Tris(2-hydroxyethyl)isocyanurate; tris(2,3-epoxypropyl) isocyanurate; trithiocyanuric acid; 1,3,5-tris(2-hydroxyethyl)isocyanurate; glycol Di(3-mercaptopropionate) (GDMP); Di-Pentaerythritol Hexa(3-mercaptopropionate) (DiPETMP); ethoxylated trimethylolpropane tri (3-mercaptopropionate); ethoxylated trimethylolpropane tri (3-mercaptopropionate); polycaprolactone tetra (3-mercaptopropionate); and the like.

Examples of A-B ligands are: pentaerythritol tetraacrylate, 6-mercaptohexanoic acid; 4-mercaptobutyric acid;

2-mercaptopropionic acid; pentaerythritol tetraacrylate; 11-mercaptoundecanoic acid; mercaptosuccinic acid; and the like.

Exemplary embodiments of the present application use a polymerizable organic host material with specific features including at least one polymerizable functional group and at least one charge transporting moiety. In some embodiments a photoinitiator (or initiator in general) is included. The QDs can phase segregate in one of opposing portions of the CCTEL, or in intermediate positions. The polymerization of the CCTEL makes the layer solvent resistant, and there may be specific interactions between the charge transport material and the QDs that render the structure particularly advantageous as compared to conventional configurations. Packing of the QDs can be directed or guided by polymerization such that a specific morphology or structure can be achieved. The QDs occupy specific positions in the CCTEL in that alternative positions are blocked because the charge transport material links the QDs. Deposition of an additional layer on top makes the QDs less susceptible to relocation within the layer or partial rinsing from the solvent being used. Accordingly, more solvent compositions can be used to deposit layers on top of the CCTEL, so long as a solvent is orthogonal to the CCTEL that is crosslinked, and thus more resistant to solvent rinsing, rather than being orthogonal only to the QDs and easier to wash away.

During the polymerization process the QDs' ligands can be replaced or partially replaced with charge transport material or with alternative ligands that functionalize the deposition surface, or the charge transport material can act as a co-ligand to improve defect passivation of QDs. The QDs in the CCTEL are partially covered by the charge transport material, and this can have various advantages. For example, in a conventional QLED, electron mobility is usually higher than hole mobility due to the intrinsic properties of the materials used. In embodiments where the CCTEL includes hole transporting material and QDs, the hole transport from the cross-linked hole transporting material directly into the QDs may be improved due to the close interpenetrating structure of the CCTEL where QDs are surrounded by cross-linked hole transporting material. This may improve the balance of the charges reaching the QDs.

Embodiments of the present application provide significant unexpected advantages over conventional configurations. For example, crosslinked material and QDs may be deeply interconnected and linked between each other, resulting in improved charge transport from the charge transport material into a quantum dot.

When a specific area of the deposited layer is exposed to UV light, a photo initiator may initiate the polymerization of the cross-linkable material. QDs, ligands of the QDs, cross-linkable material, and photo-initiator can be selected to create uniform dispersion in the deposition solvent. For example, materials with similar polarity indices may be selected to ensure homogeneity of the deposited mixtures.

FIGS. 12A, 12B, 12C, 12D1, 12D2, and 12E are drawings depicting a progression of steps constituting an exemplary method of fabricating a light-emitting device in accordance with embodiments of the present application. As referenced above, the fabrication method is described principally in connection with a QLED example having an inverted structure (with reference to FIG. 3, an inverted structure having a first electrode 302 that is a cathode and a second electrode 306 that is an anode). Comparable principles may be applicable to other device examples described in this application. As shown and described in the exemplary embodiment of FIG. 12, the emissive layer may be patterned by UV-exposing a desired area of the deposited layer. The patterned emissive layer may then be insoluble in the UV-exposed area, and the remaining materials may be removed, such as by being washed away with a solvent.

Referring to the steps illustrate in of FIGS. 12A-12E, at an initial step a substrate 1201 or comparable base layer is provided as shown in FIG. 12A. Next, as shown in FIG. 12B, a first electrode 1202 is deposited on the substrate 1201, and, thus, the base layer further may include an electrode. An additional nucleophilic interlayer 1211 is deposited on top of the electrode (alternatively the electrode can be functionalized with nucleophilic centers, for the purposes of description, either of the two alternative methods may be used) and the nucleophilic interlayer 1211 may be called a "deposition surface". Additional charge transport layers may be deposited between the electrode and the deposition surface as described above with respect to other embodiments (e.g., charge transport layers 303 shown in FIG. 3).

The electrode 1202 and the deposition surface may be deposited on the substrate 1201 using any suitable method as are known in the art. Example deposition methods include sputtering, evaporative coating, printing, chemical vapor deposition, and the like. As described above, the deposited electrode 1202 may be provided in any suitable form, and one exemplary implementation is an electrode for a TFT circuit. As shown in FIG. 12C, a mixture 1203 including a cross-linkable material 1205, quantum dots attracted to negative charges 1206 and a solvent 1204 is deposited on the deposition surface 1211. In some embodiments, the mixture 1203 additionally includes a photo initiator, as described above. Between steps depicted in FIG. 12C and the UV-exposing step in FIGS. 12D1-12D2, some of the solvent may evaporate.

As shown in FIGS. 12D1 and 12D2, ultraviolet (UV) light 1208 is applied through a mask 1207 that provides a shape or pattern through which the desired area of the mixture 1203 is exposed to the UV light 1208. Exposure of the mixture 1203 to the UV light results in the crosslinking of the cross-linkable material 1205. In embodiments in which the mixture also includes a photo initiator, the photo initiator may assist in initializing the cross-linking of the cross-linkable material. As a result of the UV exposure, a segregated CCTEL layer 1220 is formed. The crosslinking of the cross-linkable material 1205 may form the CCTEL layer in which the QDs 1206 are segregated at the bottom of the layer proximate the deposition surface 1211. In some embodiments, the cross-linkable material is crosslinked to form a cross-linked network in which the quantum dots are dispersed (but where the quantum dots do not form a part of the cross-linked network). In other embodiments, the cross-linkable material and the QDs are crosslinked to form a cross-linked network in which the quantum dots are dispersed (where the quantum dots form a part of the cross-linked network).

In the variation of the process through FIG. 12D1 to 12E, the QDs 1206 tend to remain distributed within the cross-linkable material 1205 during the deposition process, with the UV exposure 1108 causing the major portion of the segregation. UV light can initiate, together with the polymerization of the cross-linkable material, a reaction between the QDs (or the ligand of them) and the deposition surface 1211 (a nucleophilic interlayer or the electrode functionalized with nucleophilic centers) directing the segregation of the QDs toward the bottom of the CCTEL.

In the variation of the process through FIG. 12D2 and FIG. 12E, the QDs tend to segregate during the deposition process as the solvent evaporates. This can be promoted by electrostatic interactions between the QDs and the deposition surface or to higher affinity of the QDs to the nucleophilic centers of the deposition surface that can promote ligands exchange, minimizing the energy of the QDs (improving passivation).

FIG. 12E depicts a segregated CCTEL layer 1220. In the segregated CCTEL layer 1220, the QDs will become positioned within the CCTEL adjacent to or at an outer surface layer, e.g., the bottom surface layer, to form the QD layer 1209. The QDs will be immobilized within the QD layer 1209 from traveling throughout the formed crosslinked matrix 1210 that is composed of the remainder of the crosslinked material 1205. The segregated CCTEL layer 1220, therefore, is composed of a first portion, e.g., segregated QD portion 1209, mainly composed of QDs, which may be one or more layers of QDs, or other distribution of QDs, which has emissive properties thus constituting an emissive portion of the CCTEL layer. And, the segregated CCTEL layer 1120 includes a second portion mainly composed of the cross-linked material 1210 which has charge transporting and/or injecting and/or blocking properties. Accordingly, the first portion also is referred to as the emissive portion 1209 of the CCTEL 1220, and the second portion may be referred to as the charge manipulation portion 1210 of the CCTEL 1220.

As further shown in FIG. 12E, the remaining mixture 1203 and the deposition layer 1211 that had been masked by the mask 1207 of FIG. 12D1/12D2 (and thus not exposed to the UV light 1208) may be washed away with a solvent.

In some embodiments, the solvent is the same solvent used in the mixture 1203 that is deposited in FIG. 12C. In other embodiments, the solvent is a similar solvent or orthogonal solvent to the solvent used in the mixture 1203 that is deposited in FIG. 12C. Accordingly, as shown in FIG. 12E, the combination of emissive portion 1209 and charge manipulation portion 1210 remains on the deposition surface 1211. The solvent used in the mixture 1203 and/or the solvent used to wash away the remaining mixture may be evaporated during annealing (e.g., heating) of the deposited layer. The annealing may be performed at any suitable temperature that effectuates evaporation of the solvent while also maintaining the integrity of the quantum dots and charge transport material. In exemplary embodiments, annealing may be performed at a temperature ranging from 5° C. to 150° C., or at a temperature ranging from 30° C. to 150° C., or at a temperature ranging from 30° C. to 100° C.

In an exemplary embodiment, subsequent to the application of UV light as shown in FIGS. 12D1/12D2, the layer may be annealed (e.g., heated) to facilitate evaporation and removal of the solvent(s). This annealing may be performed prior to the washing or subsequent to the washing. In implementations in which the annealing is performed prior to the washing, a subsequent annealing may be performed after washing. As another example, application of UV light as shown in FIGS. 12D1/12D2 and annealing (e.g., heating) may be performed in parallel. This may remove the solvent used in the mixture 1203. Subsequent to the washing, a subsequent annealing may be performed. Additionally, annealing may be conducted prior to application of UV light as shown in FIGS. 12D1/12D2, and subsequent to the washing, a subsequent annealing may be performed.

The morphology of the emissive material may in some embodiments be controlled using one or more of UV exposure times, UV-intensity, amount of photo initiator, a ratio between QDs and cross-linkable material, concentration of the ligands of the QDs total concentration of the mixture, type and thickness of the deposition surface, and the like. For example, UV exposure time may range from 0.001 seconds to 15 minutes, and/or UV exposure intensity may range from 0.001 to 100,000 mJ/cm$^2$. The amount of photo initiator may range from 0.001 to 15 wt % of the total concentration of the QDs and the cross-linkable material in the mixture. The ratio between QDs and cross-linkable material may range from 0.001 to 1, and the total concentration of the QDs and the cross-linkable material in the mixture may range from 0.1 to 20 wt %. The concentration of the ligands of the QDs may range from 10 to 45 wt % of the overall weight of the QD including the core-shell structure and ligands. Concentration may also be referred to as "content" or "amount". The thickness of the deposition surface may range from 0.1 to 100 nm. The deposition surface may be composed of any suitable organic, metalorganic, inorganic materials with nucleophilic centers. Exemplary nucleophilic centers can be carboxylic acids, carbonyls, thiols, alcohols, amines, amides, esters, ethers, epoxides, enols, thiocyanites, isothiocyanites, thiolcarboxylic acids, dithiocarbonates, dithiocarbamates, oxetanes, diazonium salts, alkynes, alkenes, halogen salts, azides, nitrites, carbazides, conjugated bases of these, and the like.

In an exemplary embodiment, the UV exposure intensity ranges from 0.01 to 100 mJ/cm$^2$ at a UV exposure time of 0.01 to 200 seconds, the total concentration of the QDs and the cross-linkable material in the mixture ranges from 0.5 to 10 wt %, the ratio between QDs and cross-linkable material ranges from 0.01 to 0.5, the photo initiator concentration ranges from 0.1 to 5 wt % of the total concentration of the QDs and the cross-linkable material in the mixture, and the thickness of the deposition surface ranges from 1 to 50 nm.

Using an approach such as that described above, different subpixels (e.g., R, G and B) can be patterned on a given substrate in a manner that delineates the areas in which the materials that constitute the QLED subpixel structures are deposited. Combined charge transporting and emissive layers containing QDs emitting different wavelengths can be cross-linked by light irradiation in specific areas (not cross-linked material can be removed by solvent rinsing) making them patternable.

Furthermore, in exemplary embodiments, one or more activation stimuli in addition to or other than UV can be used. Examples include pressure, heat, a second exposure of light (this can be in the UV range or other ranges such as Visible or IR), and change in pH. Accordingly, in some embodiments, the method of producing the crosslinked emissive layer as described with respect to FIGS. 12A-12E may be modified, for example, with respect to the segregation step shown in FIGS. 12D1/12D2. For example, instead of the application of UV light as the activation stimulus, the crosslinking step may include instead or additionally one or more activation stimuli including the application of pressure, variation in temperature, and/or an addition to the mixture 1203 to provide a change in pH. Application of any activation stimulus or combination thereof may provide for formation of the segregated matrix that constitutes the CCTEL.

The following constitutes variations on the above methods, which further may be employed individually or in combination as may be suitable for any particular application. An exemplary embodiment may include an anode and cathode and layered CCTEL 307/1220 as described above. In such embodiment, the cross-linkable material has hole injection/transporting properties and is adjacent to the cathode. In another exemplary embodiment, the cross-linkable material has electron injection/transporting properties and is adjacent to the anode. In another exemplary embodiment, there is one or more additional electron injection/transporting layers between the CCTEL 307/1220 and the cathode. In another exemplary embodiment, there is one or more additional hole injection/transporting layers between the CCTEL 307/1220 and the anode.

Exemplary materials used to form various QLED layers described herein include, but are not limited to, the following. The electron transport and/or electron injection layers may include individual or combinations of: ZnO, 8-quinolinolato lithium (Liq.), LiF, $Cs_2CO_3$, $Mg_xZn_{1-x}O$, $Al_xZn_{1-x}O$, 2,2',2"-(1,3,5-benzinetriyl)-tris(1-phenyl-1-H-benzimidazole) (TPBi), $TiO_2$, $ZrO_2$, N4,N4'-Di(naphthalen-1-yl)-N4,N4'-bis(4-vinylphenyl)biphenyl-4,4'-diamine (VNPB), 9,9-Bis[4-[(4-ethenylphenyl)methoxy]phenyl]-N2,N7-di-1-naphthalenyl-N2,N7-diphenyl-9H-Fluorene-2,7-diamine (VB-FNPD), where $0 \leq x \leq 1$. The EML my include: QD nanoparticles which include one or more of: InP, CdSe, CdS, $CdSe_xS_{1-x}$, CdTe, $Cd_xZn_{1-x}Se$, $Cd_xZn_{1-x}Se_yS_{1-y}$, ZnSe, ZnS, ZnSTe, ZnSeTe, perovskites of the form $ABX_3$, $Zn_wCu_zIn_{1-(w+z)}S$, carbon, where $0 \leq w, x, y, z \leq 1$ and $(w+z) \leq 1$. The hole transport and/or hole injection layers may include individual or combinations of: poly(3,4-ethylenedioxythiophene):poly(styrenesulfonate) (PEDOT:PSS), poly(9,9-dioctylfluorene-co-N-(4-sec-butylphenyl)-diphenylamine) (TFB), poly(9-vinylcarbazole) (PVK), poly(N,N'-bis(4-butylphenyl)-N,N'-bisphenylbenzidine) (PolyTPD), $V_2O_5$, NiO, CuO, $WO_3$, $MoO_3$, 2,3,5,6-tetrafluoro-7,7,8,8-tetracyanoquinodimethane (F4TCNQ), 1,4,5,8,9,11-hexaazatriphenylenehexacarbonitrile (HATCN), N4,N4'-Bis(4-(6-((3-ethyloxetan-3-yl)methoxy)hexyl)phenyl)-N4,N4'-diphenylbiphenyl-4,4'-diamine (OTPD), N4,N4'-Bis(4-(6-((3-ethyloxetan-3-yl)methoxy)hexyloxy)phenyl)-N4,N4'-bis(4-methoxyphenyl)biphenyl-4,4'-diamine (QUPD), N,N'-(4,4'-(Cyclohexane-1,1-diyl)bis(4,1-phenylene))bis(N-(4-(6-(2-ethyloxetan-2-yloxy)hexyl)phenyl)-3,4,5-trifluoroaniline) (X-F6-TAPC), 3,5-di-9H-carbazol-9-yl-N,N-bis[4-[[6-[(3-ethyl-3-oxetanyl)methoxy]hexyl]oxy]phenyl]-benzenamine (Oxe-DCDPA).

The above-described methods are described as producing a single light-emitting device. It will be appreciated that the patterning of the mask may allow for producing multiple light-emitting devices to be formed in different regions of the substrate and may form an array of light-emitting devices. Furthermore, any of the above-described methods can be repeated to form light-emitting devices having different QDs, such as for example different QDs that emit different colors of light (e.g. R, G, B) in different regions of the structure, as determined by the patterning of the mask. The arrangement of light-emitting devices may form sub-pixel arrangements and pixel arrangements of sub-pixels.

In exemplary embodiments, light-emitting devices may be arranged such that the light-emitting devices are separated at least in part by one or more insulating materials. This arrangement may also be referred to as a "bank structure."

Figure 13A:
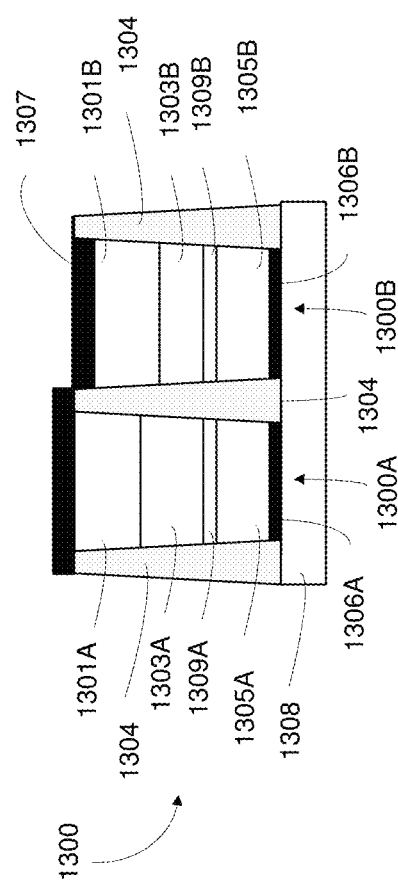
FIGS. 13A and 13B are drawings depicting an arrangement of multiple light-emitting devices formed in accordance with embodiments of the present application.
Figure 13B:
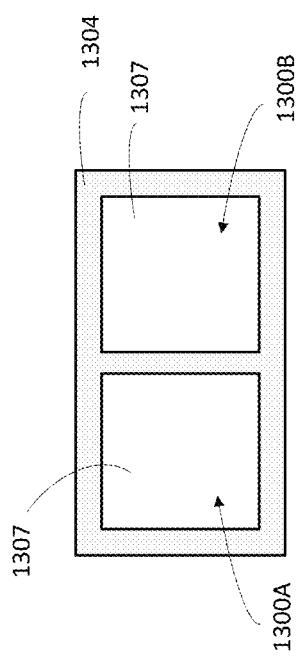

FIGS. 13A and 13B are drawings depicting a bank structure 1300 of multiple light-emitting devices formed in accordance with embodiments of the present application, with FIG. 13A illustrating a cross-section view and FIG. 13B illustrating a top view. As shown in the figures, first and second subpixels 1300A and 1300B are patterned on the same substrate 1308 and an insulating material 1304 delineates the areas in which the materials that constitute the QLED subpixel structures of devices 1300A and 1300B are deposited. FIGS. 13A and 13B illustrate an exemplary arrangement of two light-emitting devices arranged as sub-pixels, although any suitable number of light-emitting devices may be deposited in such arrangement (e.g., three light-emitting devices, four light-emitting devices, etc.). The different subpixels may be configured to emit light of different colors. Exemplary insulating materials 1304 may include, but are not limited to, polyimides.

In some examples, the insulating material may include a surface treatment, such as for example fluorine, to modify the insulating material wetting properties. For example, the insulating material may be made hydrophilic to prevent the deposited material from sticking on the banks and to ensure the subpixel is filled properly. The insulating material 1304 thus forms wells and the bottoms may include different electrodes (e.g., cathodes) for each subpixel. In the embodiment shown, the light-emitting devices include first electrodes 1306A and 1306B, a second electrode 1307 which may be common to both (or all) light-emitting devices in the bank structure, first charge transport layers 1305A and 1305B, nucleophilic interlayers 1309A and 1309B (they can be the same or different), CCTELs 1303A and 1303B, and second charge transport layers 1301A and 1301B, such that each light-emitting device 1300A and 1300B may be configured generally similar to the embodiment depicted in FIG. 5D. The bank structure may include light-emitting devices configured and/or fabricated in accordance with any of the embodiments.

In an exemplary embodiment, the light emitting devices of the bank structure 1300 are top-emitting devices and thus the first electrodes 1306A and 1306B are cathodes and the second electrode 1307 is an anode (and again the anode may be common between subpixels 1300A and 1300B). The first charge transport layers 1305A and 1305B may be deposited commonly (i.e. to both sub-pixels at the same time and with the same material and thickness), but alternatively may be deposited individually (i.e. patterned) for the different subpixels. The nucleophilic interlayers 1309A and 1309B may be deposited commonly (i.e. to both sub-pixels at the same time and with the same material and thickness), but alternatively may be deposited individually (i.e. patterned) for the different subpixels. The CCTEL 1303A includes a first QD type with a first emission wavelength, and the CCTEL 1303B includes a second QD type with a second emission wavelength different from the first emission wavelength. The second charge transport layers 1301A and 1301B may be deposited commonly (i.e. to both sub-pixels at the same time and with the same material and thickness), but alternatively may be deposited individually (i.e. patterned) for the different subpixels.

It is known that for top-emitting devices that include reflective electrodes (e.g. the first electrodes 1306A, 1306B) and partially reflective electrodes (e.g. the second electrode 1307), an optical cavity can be established for the light emitted from QDs by electroluminescence. The distance between the QDs emitting light and the first electrode, and the distance between the QDs emitting light and the second electrode, can have a significant effect on the optical mode of the cavity, and consequently on the properties of the light emitted through the second electrode 1307. For example, such parameters can affect the efficiency of light escaping from the light emitting device, and the dependence of intensity and wavelength on emission direction. Therefore, it is often preferable to select the thickness of layers disposed between the QDs and the electrodes to provide a favorable optical cavity for optimal light efficiency. Suitable thicknesses are different for different wavelengths of light (e.g. different between a device emitting red light and a device emitting green light).

A significant advantage of the CCTEL of types described in connection with FIGS. 4B-4G, and especially for the layered distribution of QDs in FIGS. 4C, 4D, 4F, and 4G, is that the distance between the quantum dots and the pertinent electrode can be selected according to the thickness of the CCTEL. For example, referring to FIG. 13A but considering conventional structure, wherein the first electrodes 1306A and 1306B are anodes, with a CCTEL 1303A and 1303B configured as in FIG. 4C or 4D in which the charge transport material of the CCTEL is a hole transporting layer, the distance between the quantum dots and the reflective anode may be adjusted by adjusting the overall thickness of the CCTEL. Consequently, as illustrated in FIG. 13A, the CCTEL 1303A and CCTEL 1303B may be provided with different thicknesses to provide favorable distances between the quantum dots and the anode as individually required for the wavelength of light emitted from the quantum dots in CCTEL 1303A and for the wavelength of light emitted from the quantum dots in CCTEL 1303B, respectively. Therefore, favorable optical cavity length and different wavelengths are achieved by depositing only the CCTEL individually between the sub-pixels. It is not necessary to deposit other charge transport layers individually between the sub-pixels to provide the suitable distance between the quantum dots and the reflective electrode. In an example, only the CCTEL is deposited individually between the subpixels and all other layers are deposited commonly to the two subpixels. In another example, the light emitting devices of the bank structure 1300 are bottom emitting devices, for which the distance between the emitting quantum dots and the reflective electrode can affect the light emission due to cavity effects. Therefore, for bottom emitting devices CCTEL of the type depicted in FIG. 4F or 4G is advantageous for comparable reasons.

An example of a light-emitting device may be produced as follows in accordance with another embodiment of the present application. 150 nm of ITO is sputtered through a shadow mask onto a 1 mm thick glass substrate to define a semi-transparent cathode region. MgZnO nanoparticles are deposited on top of the emissive layer by spin coating from ethanol followed by baking at 150° C. to form an electron transport layer. A nucleophilic interlayer of glycol Di(3-mercaptopropionate) (GDMP) is deposited. InP quantum dots, a cross-linkable material with hole transporting properties, and a photo initiator are deposited and patterned by the above-described deposition method exemplified in FIGS. 11A-11E. PEDOT:PSS is deposited on top of the CCTEL by spin coating then baked at 80° C. to form a hole injection layer. Next, 100 nm of Silver is thermally evaporated on top of the hole injection layer to provide a reflective anode. The above-described process yields a light-emitting device having a 1 mm glass substrate; a 150 nm ITO anode; a 60 nm MgZnO electron transport layer, 5 nm GDMP nucleophilic interlayer, a CCTEL including a 60 nm portion composed mainly of the crosslinked hole transporting material that acts as a hole transporting layer, and a 15 nm portion mainly composed of QDs that act as emissive layer; a 50 nm PEDOT:PSS hole injection layer; and a 100 nm Ag anode.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

INDUSTRIAL APPLICABILITY

The present invention relates to QD-LED devices that, for example, may be used for light-emitting elements in a display device. Embodiments of the present invention are applicable to many display devices to permit display devices of high resolution and high image quality. Examples of such devices include televisions, mobile phones, personal digital assistants (PDAs), tablet and laptop computers, desktop monitors, digital cameras, and like devices for which a high-resolution display is desirable.

REFERENCE SIGNS LIST

101—QD core
102—QD shell
103—QD ligands
104—QD core+shell
105—QD
200—QD-LED structure
201—substrate
202—first electrode
203—first charge transport layers
204—emissive layer
205—second charge transport layers
206—second electrode
300—QD-LED light-emitting device structure
301—substrate
302—first electrode
303—first charge transport layers
305—second charge transport layers
306—second electrode
307—combined charge transport and emissive layer (CCTEL)
401—quantum dots
402—charge transport material
403—underlayer
404—cluster
405—upper half portion
406—upper outer surface of the CCTEL
407—QD monolayer at the upper outer surface of the CCTEL
408—lower half portion
409—lower outer surface of the CCTEL
410—QD monolayer at the lower outer surface of the CCTEL
501—QDs
502—deposition surface
601—substrate (can be an electrode, a charge transporting material)
602—nucleophilic interlayer
603—electrophilic QDs
604—crosslinkable charge transporting material
605—solvent 606—combined charge transport and emissive mixture deposited
607—crosslinked matrix
608—combined charge transport and emissive layer (CC-TEL)
609—electrophilic QDs disposed as monolayer in the crosslinked material
701—substrate (can be an electrode, a charge transporting material)
702—nucleophilic functionalization of the substrate
703—electrophilic QDs
704—crosslinkable charge transporting material
705—solvent
706—combined charge transport and emissive mixture deposited
707—crosslinked matrix
708—combined charge transport and emissive layer (CC-TEL)
709—electrophilic QDs disposed as monolayer in the crosslinked material
801—substrate (can be an electrode, a charge transporting material)
802—electrophilic interlayer
803—nucleophilic QDs
804—crosslinkable charge transporting material
805—solvent
806—combined charge transport and emissive mixture deposited
807—crosslinked matrix
808—combined charge transport and emissive layer (CC-TEL)
809—nucleophilic QDs disposed as monolayer in the crosslinked material
901—substrate (can be an electrode, a charge transporting material)
902—electrophilic functionalization of the substrate
903—nucleophilic QDs
904—crosslinkable charge transporting material
905—solvent
906—combined charge transport and emissive mixture deposited
907—crosslinked matrix
908—combined charge transport and emissive layer (CC-TEL)
909—nucleophilic QDs disposed as monolayer in the crosslinked material
1001—substrate (can be an electrode, a charge transporting material)
1002—dithiol functionalized substrate (chelating site)
1003—cross-linkable material
1004—solvent
1005—quantum dots with thiol monodentate ligands
1006—combined charge transport and emissive mixture deposited
1007—crosslinked matrix
1008—combined charge transport and emissive layer (CC-TEL)
1009—quantum dot layer connected with dithiol functionalized substrate
1012—deposition surface
1101—substrate (can be an electrode, a charge transporting material)
1102—substrate functionalized with reactive group C
1103—cross-linkable material
1104—solvent
1105—quantum dots with ligands with functional groups A and B
1106—combined charge transport and emissive mixture deposited
1107—crosslinked matrix
1108—combined charge transport and emissive layer (CC-TEL)
1109—quantum dot layer connected with functionalized substrate via bonds D
1110—bifunctional ligands
1111—deposition surface
1201—substrate
1202—first electrode
1203—deposition mixture
1204—solvent
1205—cross-linkable material
1206—electrophilic QDs
1207—mask
1208—ultraviolet light
1209—electrophilic QDs layer
1210—crosslinked matrix
1211—nucleophilic interlayer
1220—CCTEL layer
1300—bank structure
1300A—first subpixel
1300B—second subpixel
1301A—second charge transport layer A
1301B—second charge transport layer B
1303A—CCTEL A
1303B—CCTEL B
1304—insulating material
1305A—first charge transport layer A
1305B—first charge transport layer B
1306A—first electrode A
1306B—first electrode B
1307—second electrode
1308—substrate
1309A—nucleophilic interlayer A
1309B—nucleophilic interlayer B

The invention claimed is:
1. A light-emitting device, comprising:
an anode;
a cathode; and
a combined charge transport and emissive layer disposed on a deposition surface between the anode and the cathode, the combined charge transport and emissive layer comprising crosslinked charge transport material and quantum dots, the quantum dots distributed unevenly within the crosslinked charge transport material and arranged relative to the deposition surface,
wherein the quantum dots comprise nucleophilic or electrophilic centers and ligands respectively bonded to the quantum dots, and
wherein the deposition surface has nucleophilic or electrophilic properties.
2. The light-emitting device of claim 1, wherein the deposition surface comprises chelating ligands.
3. The light-emitting device of claim 1, wherein the deposition surface is a dithiol functionalized surface.
4. The light-emitting device of claim 1, further comprising an interlayer disposed in contact with the combined charge transport and emissive layer, wherein the deposition surface is a surface of the interlayer.
5. The light-emitting device of claim 1, wherein at least 75% of the quantum dots are located in a half portion of the combined charge transport and emissive layer closest to the deposition surface, and at least a portion of the quantum dots are bonded to the deposition surface.

6. The light-emitting device of claim 1, wherein at least 75% of the quantum dots are located in a half portion of the combined charge transport and emissive layer distal to the deposition surface.

7. The light-emitting device of claim 1, wherein the deposition surface is a surface of the anode.

8. The light-emitting device of claim 1, wherein the deposition surface is a surface of the cathode.

9. The light-emitting device of claim 1, further comprising an electron transport layer disposed between the anode and the cathode,
wherein the deposition surface is a surface of the electron transport layer.

10. The light-emitting device of claim 1, further comprising a hole transport layer disposed between the anode and the cathode,
wherein the deposition surface is a surface of the hole transport layer.

11. The light-emitting device of claim 1, wherein the quantum dots comprise ligands having an electrophilic center and a nucleophilic center, and at least a portion of the ligands are bonded to the deposition surface.

12. A bank structure of multiple light-emitting devices comprising:
a first light emitting device and a second light emitting device, each of the first and second light emitting devices being a light emitting device according to claim 1;
an insulating material that separates at least a portion of the first light-emitting device from the second light emitting device;
wherein the first light-emitting device and the second light-emitting device are configured to emit different wavelengths.

* * * * *